(12) United States Patent
Jin et al.

(10) Patent No.: US 12,319,565 B2
(45) Date of Patent: Jun. 3, 2025

(54) MEMS ENVIRONMENTAL SENSOR AND PREPARATION METHOD THEREFOR

(71) Applicant: MultiDimension Technology Co., Ltd., Zhangjiagang (CN)

(72) Inventors: Insik Jin, Zhangjiagang (CN); Bin Qi, Zhangjiagang (CN); Songsheng Xue, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 311 days.

(21) Appl. No.: 17/996,425

(22) PCT Filed: Apr. 15, 2021

(86) PCT No.: PCT/CN2021/087504
§ 371 (c)(1),
(2) Date: Oct. 17, 2022

(87) PCT Pub. No.: WO2021/209004
PCT Pub. Date: Oct. 21, 2021

(65) Prior Publication Data
US 2023/0192477 A1   Jun. 22, 2023

(30) Foreign Application Priority Data
Apr. 17, 2020   (CN) .......................... 202010305608.0

(51) Int. Cl.
*B81B 7/02*   (2006.01)
*B81B 7/00*   (2006.01)
(Continued)

(52) U.S. Cl.
CPC .............. *B81B 7/02* (2013.01); *B81B 7/0061* (2013.01); *B81C 1/00158* (2013.01);
(Continued)

(58) Field of Classification Search
CPC .......................... H04R 23/00; H04R 2201/003; B81B 7/0032; B81B 7/0061; B81B 7/02;
(Continued)

(56) References Cited

U.S. PATENT DOCUMENTS

| | | | |
|---|---|---|---|
| 6,507,187 B1 * | 1/2003 | Olivas | ................... G01P 15/105 324/252 |
| 6,984,516 B2 | 1/2006 | Briscoe et al. | |

(Continued)

FOREIGN PATENT DOCUMENTS

| | | |
|---|---|---|
| CN | 101734607 A | 6/2010 |
| CN | 101898745 A | 12/2010 |

(Continued)

OTHER PUBLICATIONS

"Chinese Application No. 202010305608.0, First Office Action dated Jun. 30, 2021", (Jun. 30, 2021), 7 pgs.

(Continued)

*Primary Examiner* — Steven L Yeninas
(74) *Attorney, Agent, or Firm* — Schwegman Lundberg & Woessner, P.A.

(57) ABSTRACT

The disclosed invention is a MEMS environmental sensor and preparation method thereof. A transfer cavity is produced in the middle of a transfer substrate of a MEMS environmental sensor, and a transfer medium is located inside the transfer cavity. The surface area of an input port is larger than the surface area of an output port. An elastic transfer membrane is provided on the surface of the input port, and an elastic pressure membrane is provided on the surface of the output port. A load bearing cavity is provided in a load bearing substrate, a magnetic sensing element is positioned inside the load bearing cavity, and the load bearing cavity partially overlaps with the output port. The surface area of the input port of the transfer cavity is larger (Continued)

than the surface area of the output port, and on the basis of Pascal's principle, differences in the volume of the transmission cavity are used to transform a small displacement in a region of large volume into a large displacement in a region of small volume. In addition, because the output port and the end of the output port at least partially overlap, and a magnetic sensing element is arranged in the load bearing cavity, a change in displacement is produced, producing a change in a magnetic field, that is converted into a change in electrical resistance, which provides high-sensitivity and low-power detection.

16 Claims, 13 Drawing Sheets

(51) Int. Cl.
*B81C 1/00* (2006.01)
*G01D 5/14* (2006.01)
*G01L 9/00* (2006.01)
*G01L 9/14* (2006.01)
*H04R 1/02* (2006.01)
*H04R 1/28* (2006.01)
*H04R 13/00* (2006.01)
*H04R 23/00* (2006.01)

(52) U.S. Cl.
CPC ......... *B81C 1/00309* (2013.01); *G01D 5/14* (2013.01); *G01D 5/142* (2013.01); *G01L 9/0042* (2013.01); *G01L 9/14* (2013.01); *H04R 1/021* (2013.01); *H04R 1/283* (2013.01); *H04R 13/00* (2013.01); *H04R 23/00* (2013.01); *B81B 2201/0257* (2013.01); *B81B 2201/0264* (2013.01); *B81B 2203/0127* (2013.01); *B81B 2203/0315* (2013.01); *B81B 2207/07* (2013.01); *B81C 2203/0118* (2013.01); *H04R 2201/003* (2013.01)

(58) Field of Classification Search
CPC .... B81B 2201/0257; B81B 2201/0264; B81B 2203/0315; B81C 1/00047; B81C 1/00119; B81C 1/00158; B81C 1/00309; G01L 9/0042; G01L 9/14; G01D 5/14; G01D 5/142
See application file for complete search history.

(56) References Cited

U.S. PATENT DOCUMENTS

| 7,334,477 | B1 | 2/2008 | Pirkle | |
|---|---|---|---|---|
| 9,052,333 | B2* | 6/2015 | Park | G01P 15/09 |
| 2008/0267431 | A1* | 10/2008 | Leidl | H04R 1/2838 |
| | | | | 381/369 |
| 2013/0330878 | A1* | 12/2013 | Ararao | B81B 7/007 |
| | | | | 438/107 |
| 2015/0230010 | A1* | 8/2015 | Suvanto | H04R 19/005 |
| | | | | 381/150 |
| 2017/0022050 | A1 | 1/2017 | Haney et al. | |
| 2018/0261449 | A1 | 9/2018 | Iwahata et al. | |
| 2018/0362332 | A1* | 12/2018 | Khenkin | B81B 7/0058 |
| 2019/0187018 | A1 | 6/2019 | Zhao et al. | |
| 2020/0041361 | A1* | 2/2020 | Lim | G01L 1/16 |
| 2020/0267480 | A1* | 8/2020 | Zou | H04R 19/04 |
| 2021/0299782 | A1* | 9/2021 | Desjardins | B23K 9/16 |

FOREIGN PATENT DOCUMENTS

| CN | 102854339 A | 1/2013 |
|---|---|---|
| CN | 103063351 A | 4/2013 |
| CN | 103063352 A | 4/2013 |
| CN | 202853815 U | 4/2013 |
| CN | 103185612 A | 7/2013 |
| CN | 103941576 A | 7/2014 |
| CN | 103941577 A | 7/2014 |
| CN | 104502003 A | 4/2015 |
| CN | 106276770 A | 1/2017 |
| CN | 107976279 A | 5/2018 |
| CN | 108439328 A | 8/2018 |
| CN | 108489659 A | 9/2018 |
| CN | 109060106 A | 12/2018 |
| CN | 209605842 U | 11/2019 |
| CN | 110608819 A | 12/2019 |
| CN | 111473805 A | 7/2020 |
| GB | 2447700 A | 9/2008 |
| JP | 2014142267 A | 8/2014 |
| JP | 2014236096 A | 12/2014 |
| WO | WO-2021209004 A1 | 10/2021 |

OTHER PUBLICATIONS

"Chinese Application No. 202010305608.0, First Search dated Jun. 23, 2021", (Jun. 23, 2021), 2 pgs.
"Chinese Application No. 202010305608.0, Notification to Grant Patent Right for Invention dated Aug. 23, 2021", (Aug. 23, 2021), 3 pgs.
"International Application No. PCT/CN2021/087504, International Search Report and Written Opinion dated Jun. 30, 2021", (Jun. 30, 2021), 10 pgs.

* cited by examiner

MEMS ENVIRONMENTAL SENSOR AND PREPARATION METHOD THEREFOR

PRIORITY CLAIM TO RELATED APPLICATIONS

This application is a U.S. national stage filing under 35 U.S.C. § 371 from International Application No. PCT/CN2021/087504, filed on 15 Apr. 2021, and published as WO2021/209004 on 21 Oct. 2021, which claims the benefit under 35 U.S.C. 119 to Chinese Application No. 202010305608.0, filed on 17 Apr. 2020.

TECHNICAL FIELD

Embodiments of the present invention relates to the technical field of environmental parameter detection sensors, and more particularly, to a MEMS environmental sensor and a preparation method thereof.

BACKGROUND

At present, environmental sensors include a series of subdivisions, such as temperature sensors, pressure sensors, displacement sensors, vibration sensors, microphones, etc., and there are relatively great differences in chip design, material, process, and encapsulation structure between the various subdivisions, making it difficult to integrate a plurality of different types of environmental sensors or leading to complex integration processes. In addition, existing sensor chips for pressure sensors, displacement sensors, vibration sensors, microphones, etc. cannot meet the requirements for both high signal-to-noise ratio and low power consumption at the same time.

SUMMARY

In view of this, embodiments of the present invention provide a MEMS environmental sensor and a preparation method thereof, wherein, on the basis of the Pascal's principle, a difference in dimensions of an input port and an output port of a transfer cavity is used to transform a small displacement in a region of large volume into a large displacement in a region of small volume; a multi-component highly sensitive material is adapted as a magnetic sensing element to convert a change in displacement, through an intermediate variable, such as a change in magnetic field, into a change in electrical resistance; and by means of the characteristics of the magnetic sensing element, i.e., high sensitivity and low power consumption, sensors for environmental parameters, such as environmental temperature, pressure, displacement, vibration, and acoustic wave, are prepared on a single chip using the same process, which facilitates the integration and miniaturization of environmental sensors while ensuring the high signal-to-noise ratio and low power consumption of the sensors.

According to a first aspect, the embodiments of the present invention provide a MEMS environmental sensor, comprising a transfer substrate, a transfer medium, a load bearing substrate, and at least one magnetic sensing element; a transfer cavity is provided inside the transfer substrate, the transfer cavity penetrates the transfer substrate, and the transfer medium is located inside the transfer cavity; the transfer cavity comprises at least one input port and at least one output port, and the surface area of the input port is larger than the surface area of the output port; an elastic transfer membrane is provided on the surface of the input port, and an elastic pressure membrane is provided on the surface of the output port; a load bearing cavity is provided in the load bearing substrate, the load bearing cavity penetrates the load bearing substrate, and the magnetic sensing element is at least positioned inside the load bearing cavity; and the load bearing cavity is located at one side of the elastic pressure membrane that is away from the transfer cavity, and a perpendicular projection of the load bearing cavity on the plane where the elastic pressure membrane is located at least partially overlaps with a perpendicular projection of the output port on the plane where the elastic pressure membrane is located.

According to a second aspect, the embodiments of the present invention further provide a preparation method for a MEMS environmental sensor for preparing the MEMS environmental sensor according to the first aspect, the preparation method comprising:

selecting a semiconductor substrate, the semiconductor substrate comprising a transfer substrate, a load bearing substrate, and an elastic film located between the transfer substrate and the load bearing substrate;

preparing a transfer cavity inside the transfer substrate, wherein the transfer cavity penetrates the transfer substrate, and the transfer medium is located inside the transfer cavity; the transfer cavity comprises at least one input port and at least one output port, and the surface area of the input port is larger than the surface area of the output port; preparing an elastic transfer membrane on the surface of the input port, and preparing an elastic pressure membrane on the surface of the output port, wherein at least the elastic pressure membrane is the elastic film;

preparing a load bearing cavity in the load bearing substrate, wherein the load bearing cavity penetrates the load bearing substrate, the load bearing cavity is located at one side of the elastic membrane that is away from the transfer cavity, and a perpendicular projection of the load bearing cavity on the plane where the elastic pressure membrane is located at least partially overlaps with a perpendicular projection of the output port on the plane where the elastic pressure membrane is located; and preparing at least one magnetic sensing element at least in the load bearing cavity.

According to the MEMS environmental sensor and the preparation method thereof provided by the embodiments of the present invention, the transfer cavity is provided inside the transfer substrate, and the surface area of the input port in the transfer cavity is further set to be larger than the surface area of the output port; on the basis of the Pascal's principle, a difference in volume of the transfer cavity is used to transform a small displacement in a region of large volume into a large displacement in a region of small volume; at the same time, a perpendicular projection of the load bearing cavity on the plane where the elastic pressure membrane is located is set to at least partially overlap with a perpendicular projection of the output port on the plane where the elastic pressure membrane is located, which transmits the large displacement to the load bearing cavity, and since the multi-component highly sensitive material is adapted as a magnetic sensing element in the load bearing cavity, the change in displacement can thus be converted, through an intermediate variable, such as a change in magnetic field, into a change in electrical resistance; and by means of the characteristics of the magnetic sensing element, i.e., high sensitivity and low power consumption, sensors for environmental parameters, such as environmental temperature, pressure, displacement, vibration, and acoustic wave, are prepared on a single chip using the same process, which facilitates the integration and miniaturization of environmental sensors while ensuring the high signal-to-noise ratio and low power consumption of the sensors.

BRIEF DESCRIPTION OF THE DRAWINGS

Other features, objectives, and advantages of the present invention will become more apparent by reading the detailed description of nonlimiting embodiments made below with reference to the accompanying drawings.

DETAILED DESCRIPTION

To make the objectives, technical solutions, and advantages of the present invention clearer, the technical solutions of the present invention will be completely described below through implementation manners and with reference to the accompanying drawings in the embodiments of the present invention. Apparently, the described embodiments are part of, not all, the embodiments of the present invention. All the other embodiments obtained by a person of ordinary skill in the art based on the embodiments of the present invention without involving inventive skill shall be encompassed by the protection scope of the present invention.

Figure 1:
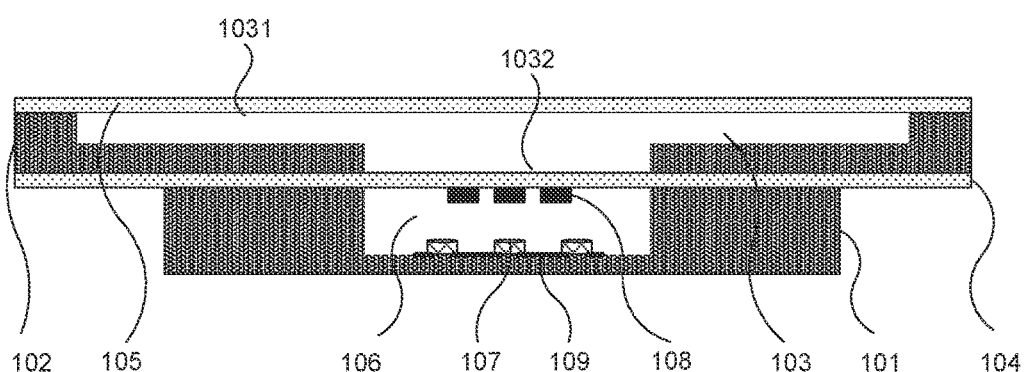
FIG. 1 is a schematic diagram of a cross-sectional structure of a MEMS environmental sensor according to an embodiment of the present invention.
Figure 2:
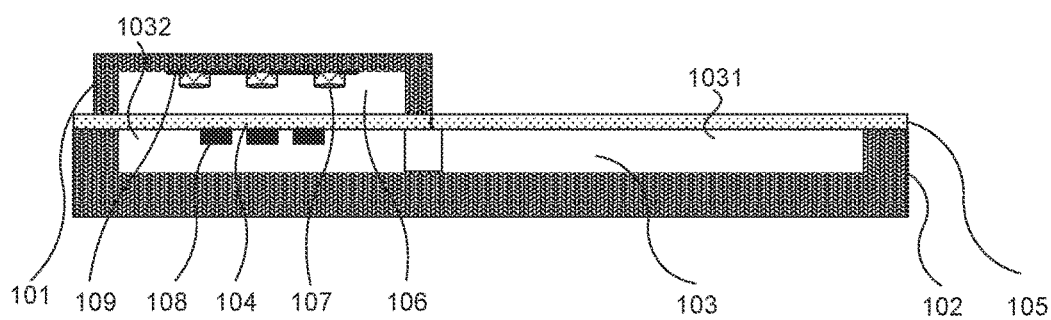
FIG. 2 is a schematic diagram of a cross-sectional structure of another MEMS environmental sensor according to an embodiment of the present invention.
Figure 3:
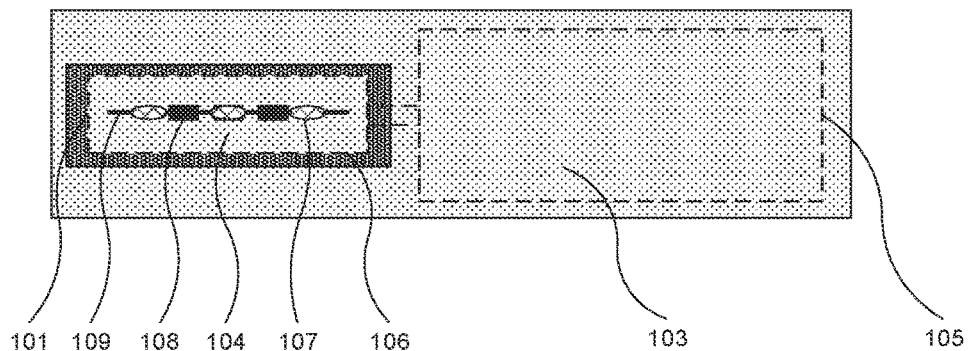
FIG. 3 is a schematic diagram of a top view structure of a MEMS environmental sensor according to an embodiment of the present invention.
Figure 4:
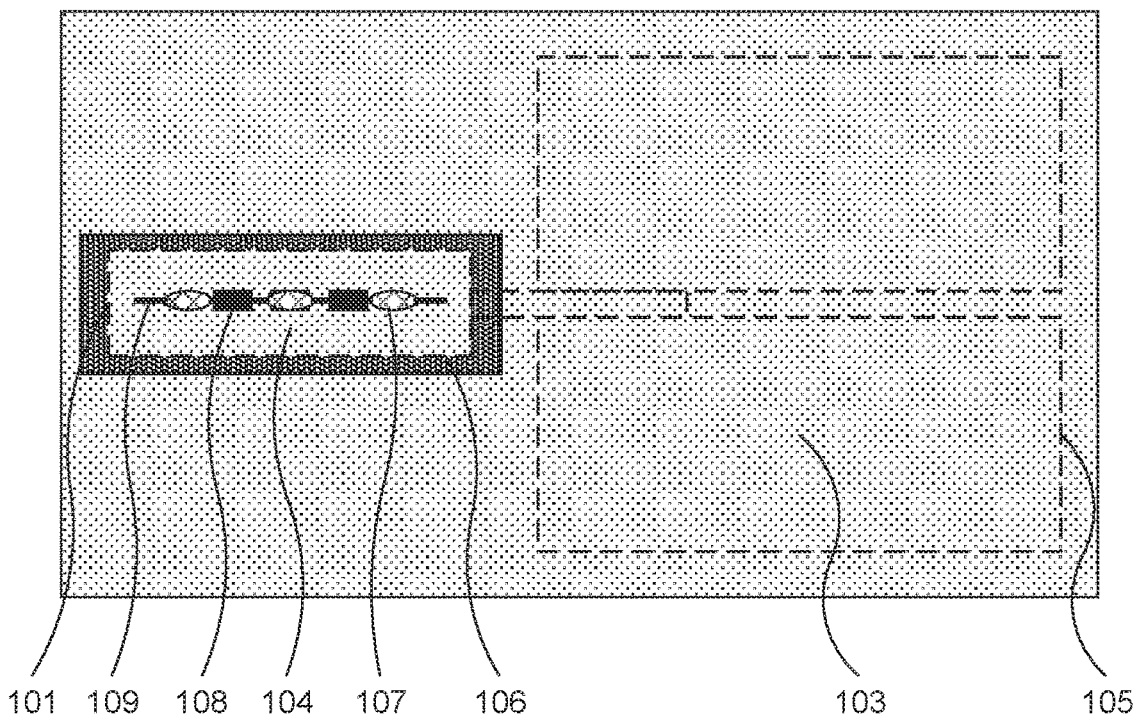
FIG. 4 is a schematic diagram of a top view structure of another MEMS environmental sensor according to an embodiment of the present invention.

FIG. 1 is a schematic diagram of a cross-sectional structure of a MEMS environmental sensor according to an embodiment of the present invention, FIG. 2 is a schematic diagram of a cross-sectional structure of another MEMS environmental sensor according to an embodiment of the present invention, FIG. 3 is a schematic diagram of a top view structure of a MEMS environmental sensor according to an embodiment of the present invention, and FIG. 4 is a schematic diagram of a top view structure of another MEMS environmental sensor according to an embodiment of the present invention. With reference to FIG. 1 to FIG. 4, the MEMS environmental sensor 10 provided by the embodiments of the present invention comprises a transfer substrate 102, a transfer medium, a load bearing substrate 101, and at least one magnetic sensing element 107; a transfer cavity 103 is provided inside the transfer substrate 102, the transfer cavity 103 penetrates the transfer substrate 102, and the transfer medium is located inside the transfer cavity 103; the transfer cavity 103 comprises at least one input port 1031 and at least one output port 1032, and the surface area of the input port 1031 is larger than the surface area of the output port 1032; and an elastic transfer membrane 105 is provided on the surface of the input port 1031, and an elastic pressure membrane 104 is provided on the surface of the output port 1032; a load bearing cavity 106 is provided in the load bearing substrate 101, the load bearing cavity 106 penetrates the load bearing substrate 101, and the magnetic sensing element 107 is at least positioned inside the load bearing cavity 106; and the load bearing cavity 103 is located at one side of the elastic pressure membrane 104 that is away from the transfer cavity 103, and a perpendicular projection of the load bearing cavity 106 on the plane where the elastic pressure membrane 104 is located at least partially overlaps with a perpendicular projection of the output port 1032 on the plane where the elastic pressure membrane 104 is located.

Illustratively, as shown in FIG. 1 to FIG. 4, the transfer cavity 103 penetrating the transfer substrate 102 is formed inside the transfer substrate 102, the transfer cavity 103 is filled with the transfer medium (not shown), and the transfer medium is a liquid or gas capable of force transmission, which may be the air herein. The transfer port 1031 and the output port 1032 are formed on the surface of the transfer cavity 103, the surface area of the input port 1031 is larger than the surface area of the output port 1032, the elastic transfer membrane 105 is provided on the surface of the input port 1031, and the elastic pressure membrane 104 is provided on the surface of the output port 1032. When an external environmental pressure or vibration acts on the external surface of the elastic transfer membrane 105 that has a relatively large surface area, the acting force is transferred via the transfer medium to the elastic pressure membrane 104 that has a relatively small surface area. According to the Pascal's principle, the deformation amplitude of the elastic pressure membrane 104 that has a relatively small surface area is greater than the deformation of the elastic transfer membrane 105 that has a relatively large surface area, such that the external environmental change is amplified.

Furthermore, the load bearing cavity 106 that penetrates the load bearing substrate 101 is provided in the load bearing substrate 101, the load bearing cavity 103 is located at one side of the elastic pressure membrane 104 that is away from the transfer cavity 103, the perpendicular projection of the load bearing cavity 106 on the plane where the elastic pressure membrane 104 is located at least partially overlaps with the perpendicular projection of the output port 1032 on the plane where the elastic pressure membrane 104 is located, and the magnetic sensing element 107 is at least positioned inside the load bearing cavity 106. In this way, when a corresponding displacement occurs to the elastic pressure membrane 104, the magnetic field at the position of the magnetic sensing element 107 is caused to change. The magnetic sensing element 107 may be a highly sensitive magnetoresistance element, and thus, the change in displacement is converted, through an intermediate variable, such as a change in magnetic field, into a change in electrical resistance; as a result, an external pressure, vibration, or acoustic wave signal can be accurately measured; and at the same time, by means of the characteristics of the magnetic sensing element, i.e., high sensitivity and low power consumption, sensors for environmental parameters, such as pressure, displacement, vibration, and acoustic wave, are prepared on a single chip using the same process, which facilitates the integration and miniaturization design of MEMS environmental sensors and complies with the development trend of MEMS environmental sensors.

Furthermore, in combination with FIG. 3 and FIG. 4, the transfer cavity 103 provided by the embodiments of the present invention may comprise one or more transfer ports and one or more output ports. FIG. 3 takes the transfer cavity 103 comprising one transfer port and one output port as an example for description, FIG. 4 takes the transfer cavity 103 comprising two transfer ports and one output port as an example for description, and the numbers of transfer ports and output ports specifically comprised in the transfer cavity 103 are not limited in the embodiments of the present invention.

It should be noted that the transfer cavity 103 may comprise a first surface and a second surface that are provided to oppose each other, the input port 1031 is located on the first surface of the transfer cavity 103, and the output port 1032 is located on the second surface of the transfer cavity 103; alternatively, the input port 1031 and the output port 1032 are both located on the second surface of the transfer cavity 103, and the first surface of the transfer cavity 103 is a rigid bottom surface; the load bearing cavity 102 comprises a third surface and a fourth surface that are provided to oppose each other, the third surface is attached to the elastic pressure membrane 104, and the fourth surface is a rigid bottom surface. That is, there are two different setting manners for the input port 1031 and the output port 1032 in the transfer cavity 103. One of the setting manners is as shown in FIG. 1, in which the input port 1031 and the output port 1032 are located on different surfaces of the transfer cavity 103, the input port 1031 and the output port 1032 are stacked, the input port 1031 is located on the first surface of the transfer cavity 103, and the output port 1032 is located on the second surface of the transfer cavity 103. In the other setting manner, the input port 1031 and the output port 1032 are located on the same surface of the transfer cavity 103, the input port 1031 and the output port 1032 are provided in parallel, the input port 1031 and the output port 1032 are both located on the second surface of the transfer cavity 103, and the first surface of the transfer cavity 103 is a rigid bottom surface, as shown in FIG. 2 to FIG. 4. In addition, regardless of the setting manner of the input port 1031 and the output port 1032, the load bearing cavity 102 always comprises a third surface and a fourth surface that are provided to oppose each other, the third surface is attached to the elastic pressure membrane 104, and the fourth surface is a rigid bottom surface, as shown in FIG. 1 and FIG. 2. The setting manner of the input port 1031 and the output port 1032 is not limited in the embodiments of the present invention, and the two different implementations will be described in detail respectively in the embodiments of the present invention.

It should be further noted that in FIG. 3 and FIG. 4, to illustrate the internal structure of the load bearing cavity 106 in detail, the rigid bottom surface of the load bearing cavity 106 is not shown in FIG. 3 and FIG. 4, but the internal structure of the load bearing cavity 106 is directly shown.

In summary, according to the MEMS environmental sensor provided by the embodiments of the present invention, the transfer cavity is provided inside the transfer substrate, and the surface area of the input port in the transfer cavity is further set to be larger than the surface area of the output port; on the basis of the Pascal's principle, a difference in volume of the transfer cavity is used to transform a small displacement in a region of large volume into a large displacement in a region of small volume; at the same time, a perpendicular projection of the load bearing cavity on the plane where the elastic pressure membrane is located is set to at least partially overlap with a perpendicular projection of the output port on the plane where the elastic pressure membrane is located, which transmits the large displacement to the load bearing cavity, and since the multi-component highly sensitive material is adapted as a magnetic sensing element in the load bearing cavity, the change in displacement can thus be converted, through an intermediate variable, such as a change in magnetic field, into a change in electrical resistance; and by means of the characteristics of the magnetic sensing element, i.e., high sensitivity and low power consumption, sensors for environmental parameters, such as pressure, displacement, vibration, and acoustic wave, are prepared on a single chip using the same process, which facilitates the integration and miniaturization of environmental sensors while ensuring the high signal-to-noise ratio and low power consumption of the sensors.

As a feasible implementation, the first surface and the second surface of the transfer cavity 103 are parallel to each other and are both parallel to the plane where the surface of the transfer substrate 102 is located; the third surface and the fourth surface of the load bearing cavity 106 are parallel to each other and are both parallel to the plane where the surface of the load bearing substrate 101 is located. In this way, it be ensured that the MEMS environmental sensor provided by the embodiments of the present invention has a regular structure, which facilitates the miniaturization design of MEMS environmental sensors and enhances the universality of MEMS environmental sensors.

As a feasible implementation, the magnetic sensing element 107 may comprise one of anisotropic magnetoresistance, giant magnetoresistance, tunnel junction magnetoresistance, Hall element, piezoelectric material, or dielectric material, and by setting the magnetic sensing element 107 to be a highly sensitive magnetoresistance element, the MEMS environmental sensor is ensured to be able to accurately measure an external environmental temperature, pressure, vibration, or acoustic wave signal.

Figure 5:
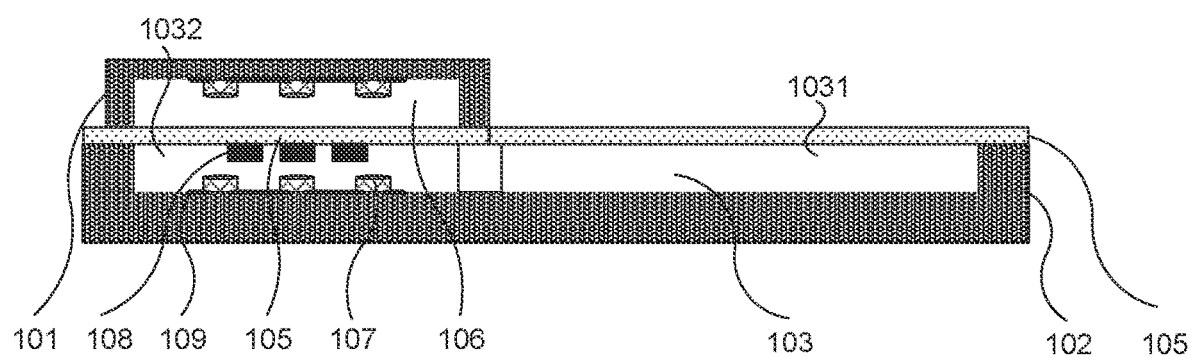
FIG. 5 is a schematic diagram of a cross-sectional structure of another MEMS environmental sensor according to an embodiment of the present invention.

As a feasible implementation, FIG. 5 is a schematic diagram of a cross-sectional structure of another MEMS environmental sensor according to an embodiment of the present invention. In combination with FIG. 1, FIG. 2, and FIG. 5, the magnetic sensing element 107 may be provided on the fourth surface of the load bearing cavity 106 (as shown in FIG. 1 and FIG. 2); the magnetic sensing element 107 may also be provided on the first surface of the transfer cavity 103 (as shown in FIG. 5), the surface of one side of the elastic pressure membrane 104 facing the load bearing cavity 106, or the surface of one side of the elastic pressure membrane 104 facing the transfer cavity 103 (not shown).

Specifically, in one embodiment of the present invention, at least one magnetic sensing element 107 is provided in at least the load bearing cavity 106. At this moment, the magnetic sensing element 107 may be provided on the fourth surface of the load bearing cavity 106 (as shown in FIG. 1 and FIG. 2), and may also be provided on the surface of one side of the elastic pressure membrane 104 facing the load bearing cavity 106 (not shown). Moreover, the magnetic sensing element 107 may also be provided in the transfer cavity 103, and at this moment, the magnetic sensing element 107 may be provided on the first surface of the transfer cavity 103 (as shown in FIG. 5) or may also be provided on the surface of one side of the elastic pressure membrane 104 facing the transfer cavity 103 (not shown). The specific position where the magnetic sensing element 107 is provided is not limited in the embodiments of the present invention. Furthermore, when the magnetic sensing element 107 is provided in both the load bearing cavity 106 and the transfer cavity 103, the differential output of magnetic field signals is thus realized, which in turn reduces the external interference and also improves the sensitivity of the MEMS environmental sensor.

Figure 6:
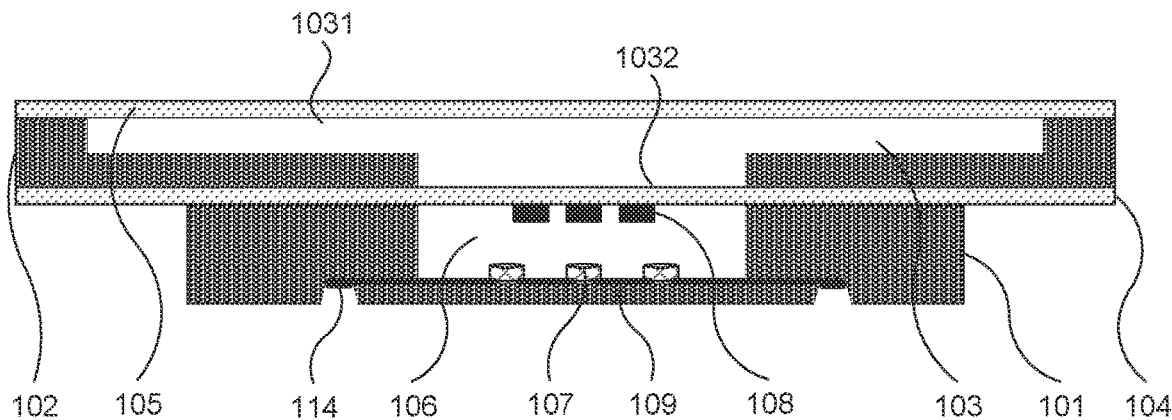
FIG. 6 is a schematic diagram of a cross-sectional structure of another MEMS environmental sensor according to an embodiment of the present invention.
Figure 7:
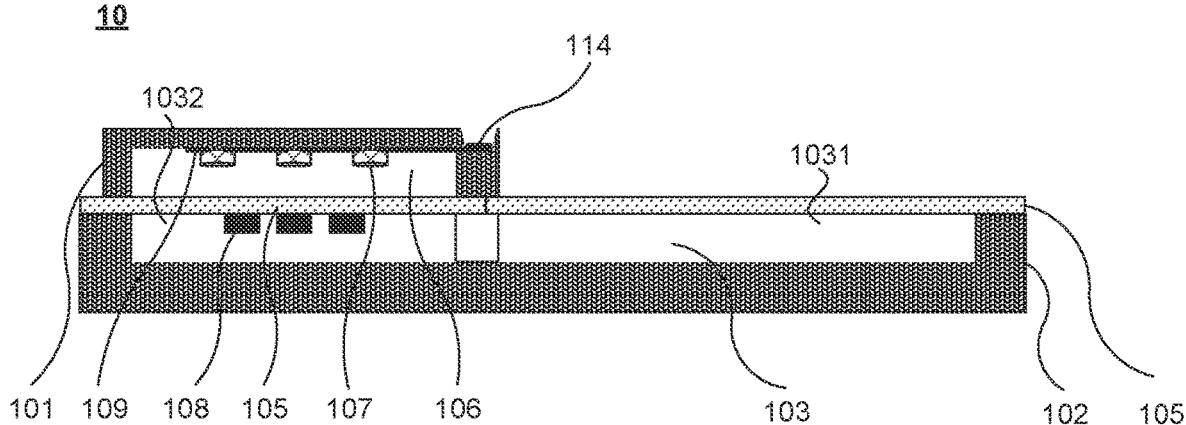
FIG. 7 is a schematic diagram of a cross-sectional structure of another MEMS environmental sensor according to an embodiment of the present invention.

As a feasible implementation, FIG. 6 is a schematic diagram of a cross-sectional structure of another MEMS environmental sensor according to an embodiment of the present invention, and FIG. 7 is a schematic diagram of a cross-sectional structure of another MEMS environmental sensor according to an embodiment of the present invention. As shown in FIG. 6 and FIG. 7, the magnetic sensing element 107 is provided on the fourth surface of the load bearing cavity 106; the MEMS environmental sensor 10 may further comprise a connection wire 109 and a contact electrode 114 disposed on one side of the magnetic sensing element 107 that is away from the elastic pressure membrane 104, the connection wire 109 is electrically connected with the magnetic sensing element 107, and the contact electrode 114 is electrically connected with the connection wire 109. Here, FIG. 6 takes the input port 1031 being located on the first surface of the transfer cavity 103 and the output port 1032 being located on the second surface of the transfer cavity 103 as an example for description, and FIG. 7 takes the input port 1031 and the output port 1032 being both located on the second surface of the transfer cavity 103 as an example for description. As shown in FIG. 6 and FIG. 7, the MEMS environmental sensor 10 provided by the embodiments of the present invention may further comprise the connection wire 109 and the contact electrode 114 disposed on one side of the magnetic sensing element 107 that is away from the elastic pressure membrane 104, the magnetic sensing element 107 transmits a signal to the contact electrode 114 via the connection wire 109, which ensures that the signal sensed by the magnetic sensing element 107 can be promptly and normally transmitted out, that the MEMS environmental sensor senses environmental parameters such as external pressure, displacement, vibration, and acoustic wave, and that the MEMS environmental sensor can operate normally.

It should be noted that FIG. 6 and FIG. 7 only take the magnetic sensing element 107 being provided on the fourth surface of the load bearing cavity 106 as an example for description, and it can be appreciated that, when the magnetic sensing element 107 is provided on the surface of one side of the elastic pressure membrane 104 facing the load bearing cavity 106, the first surface of the transfer cavity 103, or the surface of one side of the elastic pressure membrane 104 facing the transfer cavity 103, it is similarly necessary to provide the connection wire 109 and the contact electrode 114 to ensure that a signal sensed by the magnetic sensing element 107 can be promptly and normally transmitted out. The manner in which the connection wire 109 and the contact electrode 114 are provided may be the same as the setting manner shown in FIG. 6 and FIG. 7, but the setting positions are different. Specific setting positions will not be elaborated in the embodiments of the present invention.

As a feasible implementation, the MEMS environmental sensor 10 may further comprise a signal converting material, at least part of the signal converting material is uniformly dispersed in a particulate form inside the transfer medium, or at least part of the signal converting material is disposed in a film form on the surface of the elastic pressure membrane 104. Specifically, the signal converting material provided in the embodiments of the present invention may be a magnetic material with high magnetic permeability or large remanence, and by adding the signal converting material, the amplitude of the change to the intermediate variable is increased, and the sensitivity of the MEMS environmental sensor is improved.

There may be a variety of setting manners for the signal converting material in the embodiments of the present invention, and a specific setting manner for the signal converting material will be described below.

Figure 8:
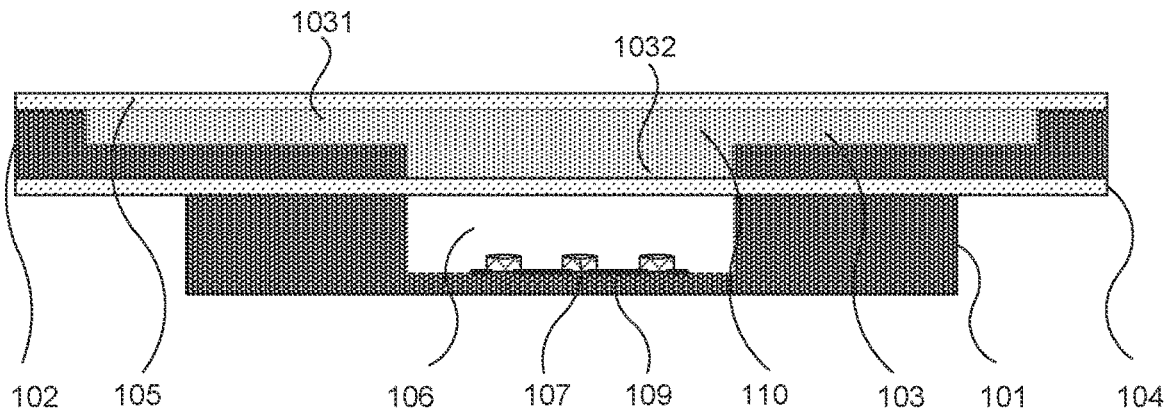
FIG. 8 is a schematic diagram of a cross-sectional structure of another MEMS environmental sensor according to an embodiment of the present invention.
Figure 9:
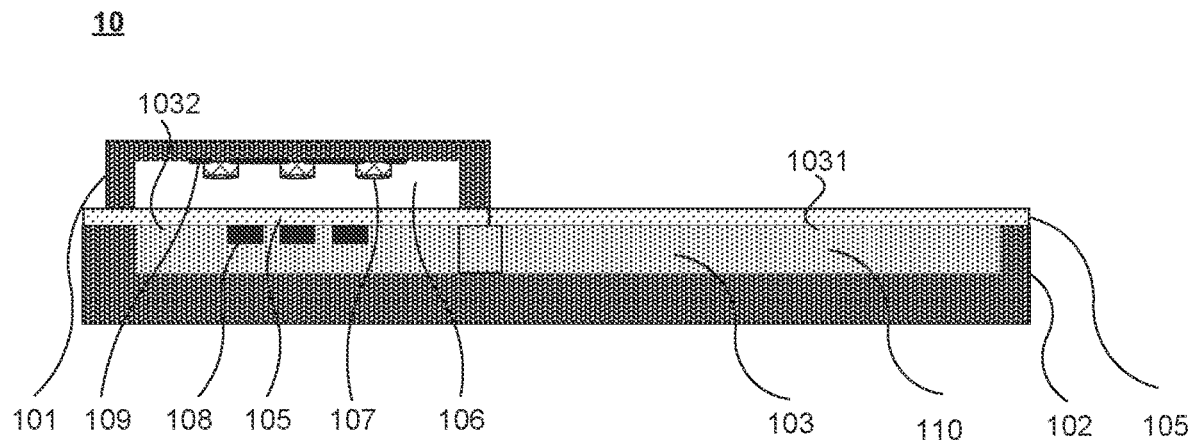
FIG. 9 is a schematic diagram of a cross-sectional structure of another MEMS environmental sensor according to an embodiment of the present invention.

FIG. 8 is a schematic diagram of a cross-sectional structure of another MEMS environmental sensor according to an embodiment of the present invention, and FIG. 9 is a schematic diagram of a cross-sectional structure of another MEMS environmental sensor according to an embodiment of the present invention. In combination with FIG. 1, FIG. 2, FIG. 5, FIG. 8, and FIG. 9, the signal converting material may comprise a magnetic material 110, the magnetic material 110 is uniformly dispersed in a particulate form inside the transfer medium, as shown in FIG. 8 and FIG. 9; alternatively, the magnetic material is disposed in a film form on the surface of one side of the elastic pressure membrane 104 facing the transfer cavity 103 and/or on the surface of one side of the elastic pressure membrane 104 facing the load bearing cavity 106, as shown by the magnetic film 108 in FIG. 1, FIG. 2, and FIG. 5. Here, FIG. 8 takes the input port 1031 being located on the first surface of the transfer cavity 103 and the output port 1032 being located on the second surface of the transfer cavity 103 as an example for description, and FIG. 9 takes the input port 1031 and the output port 1032 being both located on the second surface of the transfer cavity 103 as an example for description. As shown in FIG. 8 and FIG. 9, the magnetic material 110 is caused to undergo displacement in the deformation process of the elastic transfer membrane 105 and the elastic pressure membrane 104, such that the magnetic field at the position of the magnetic sensing element 107 undergoes a corresponding change, thereby obtaining environmental change parameters. FIG. 1 takes the magnetic film 108 being located on the surface of one side of the elastic pressure membrane 104 facing the load bearing cavity 106 as an example for description, and FIG. 2 and FIG. 5 take the magnetic film 108 being located on the surface of one side of the elastic pressure membrane 104 facing the transfer cavity 103 as an example for description. As show in FIG. 1, FIG. 2, and FIG. 5, when an external environmental pressure or vibration acts on the external surface of the elastic transfer membrane 105 that has a relatively large surface area, the acting force is transferred via the transfer medium to the elastic pressure membrane 104 that has a relatively small surface area, which causes a corresponding displacement occurring to the magnetic film 108 on the surface of the pressure membrane 104, thereby causing a change in the magnetic field at the position of the magnetic sensing element 107 and thus obtaining environmental change parameters.

Figure 10:
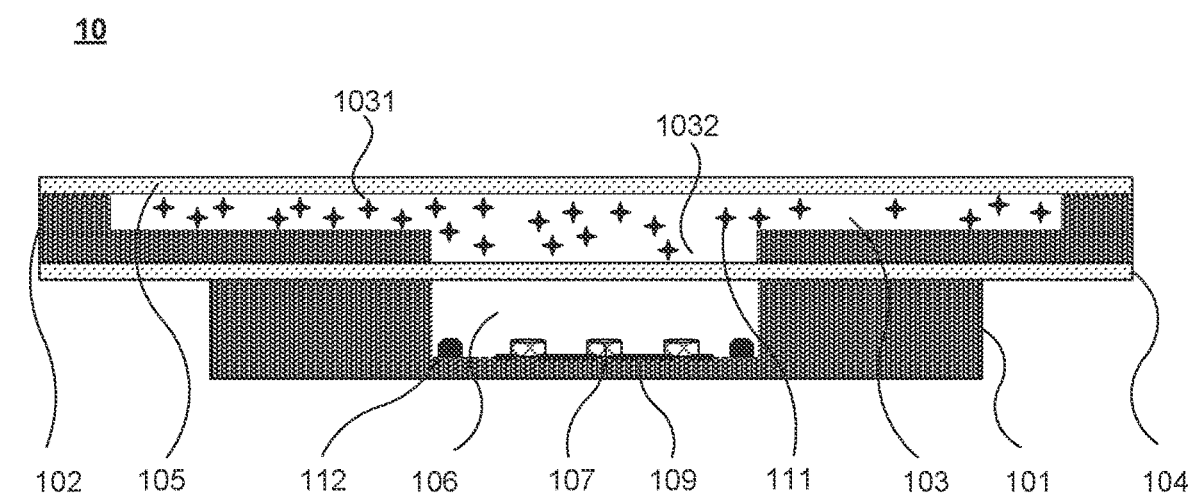
FIG. 10 is a schematic diagram of a cross-sectional structure of another MEMS environmental sensor according to an embodiment of the present invention.
Figure 11:
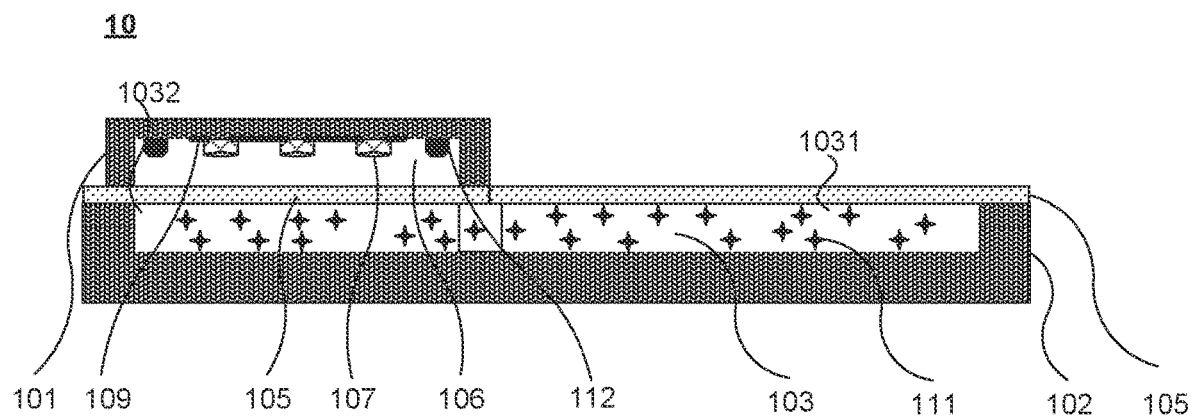
FIG. 11 is a schematic diagram of a cross-sectional structure of another MEMS environmental sensor according to an embodiment of the present invention.

FIG. 10 is a schematic diagram of a cross-sectional structure of another MEMS environmental sensor according to an embodiment of the present invention, and FIG. 11 is a schematic diagram of a cross-sectional structure of another MEMS environmental sensor according to an embodiment of the present invention. As shown in FIG. 10 and FIG. 11, the signal converting material comprises a non-magnetic metal material 111 and an excitation coil 112, and the non-magnetic metal material 111 is uniformly dispersed in a particulate form inside the transfer medium, as shown in FIG. 10 and FIG. 11; alternatively, the non-magnetic metal material 111 is disposed in a film form on the surface of one side of the elastic pressure membrane 104 facing the transfer cavity 103 and/or on the surface of one side of the elastic pressure membrane 104 facing the load bearing cavity 106 (not shown), the excitation coil 112 is provided inside the load bearing cavity 106; a radio frequency alternating current is loaded in the excitation cod 106 and used for driving the non-magnetic metal material 111 to produce an induced eddy current, thereby producing an induced magnetic field. Here, FIG. 10 takes the input port 1031 being located on the first surface of the transfer cavity 103 and the output port 1032 being located on the second surface of the transfer cavity 103 as an example for description, and FIG. 11 takes the input port 1031 and the output port 1032 being both located on the second surface of the transfer cavity 103 as an example for description. As shown in FIG. 10 and FIG. 11, by loading a radio frequency alternating current in the excitation coil 112, the non-magnetic metal material 111 is caused to produce an induced eddy current, thereby producing an induced magnetic field, and then causing, through the displacement of the non-magnetic metal material 111, the magnetic field at the position of the magnetic sensing element 107 to undergo a corresponding change, thereby obtaining environmental change parameters.

A variety of different setting manners of the signal converting material are described in detail above, and a specific setting manner of the signal converting material is not limited in the embodiments of the present invention, as long as it is ensured that by adding the signal converting material, the amplitude of the change to the intermediate variable can be increased, and the sensitivity of the MEMS environmental sensor can then be improved.

Figure 12:
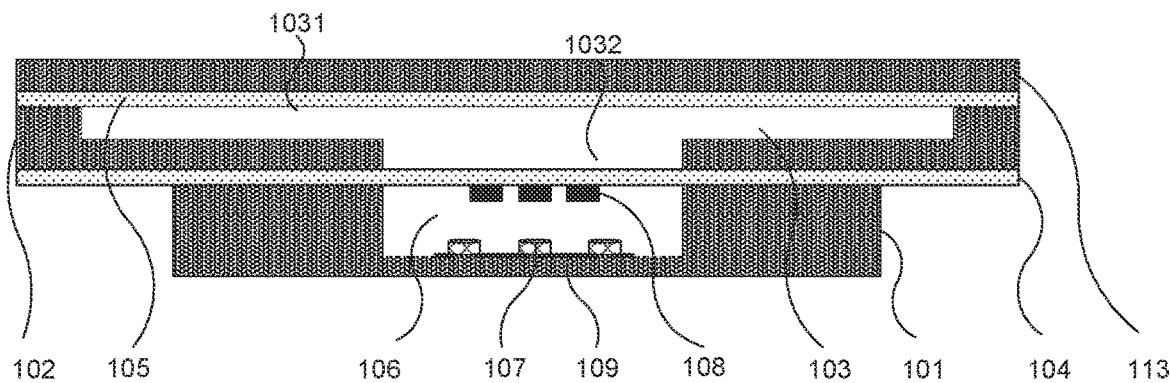
FIG. 12 is a schematic diagram of a cross-sectional structure of another MEMS environmental sensor according to an embodiment of the present invention.
Figure 13:
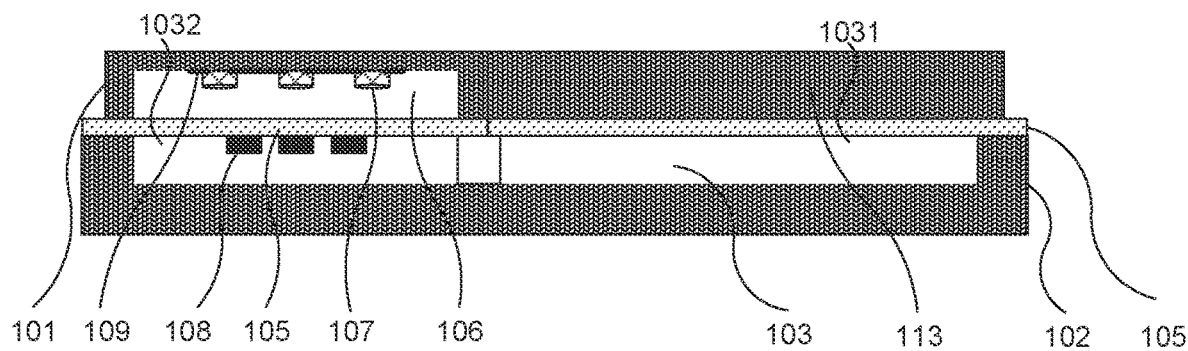
FIG. 13 is a schematic diagram of a cross-sectional structure of another MEMS environmental sensor according to an embodiment of the present invention.

On the basis of the above embodiments, FIG. 12 is a schematic diagram of a cross-sectional structure of another MEMS environmental sensor according to an embodiment of the present invention, and FIG. 13 is a schematic diagram of a cross-sectional structure of another MEMS environmental sensor according to an embodiment of the present invention. As shown in FIG. 12 and FIG. 13, a rigid covering layer 113 is provided on the surface of one side of the elastic transfer membrane 105 away from the transfer cavity 103 in the MEMS environmental sensor 10 according to the embodiment of the present invention. Here, FIG. 12 takes the input port 1031 being located on the first surface of the transfer cavity 103 and the output port 1032 being located on the second surface of the transfer cavity 103 as an example for description, and FIG. 13 takes the input port 1031 and the output port 1032 being both located on the second surface of the transfer cavity 103 as an example for description. As shown in FIG. 12 and FIG. 13, the rigid coveting layer 113 completely covers between the elastic transfer membrane 105 of the MEMS environmental sensor 10 and the external environment, and at this moment, the displacement of the elastic transfer membrane 105 is only influenced by the change in volume of the transfer medium caused by temperature, but not by external pressure, vibration, or acoustic wave. This design is used for measuring environmental temperature, ensures that the MEMS environmental sensor can realize the measurement of environmental temperature, and broadens the range of use of MFMS environmental sensor measurement.

Figure 14:
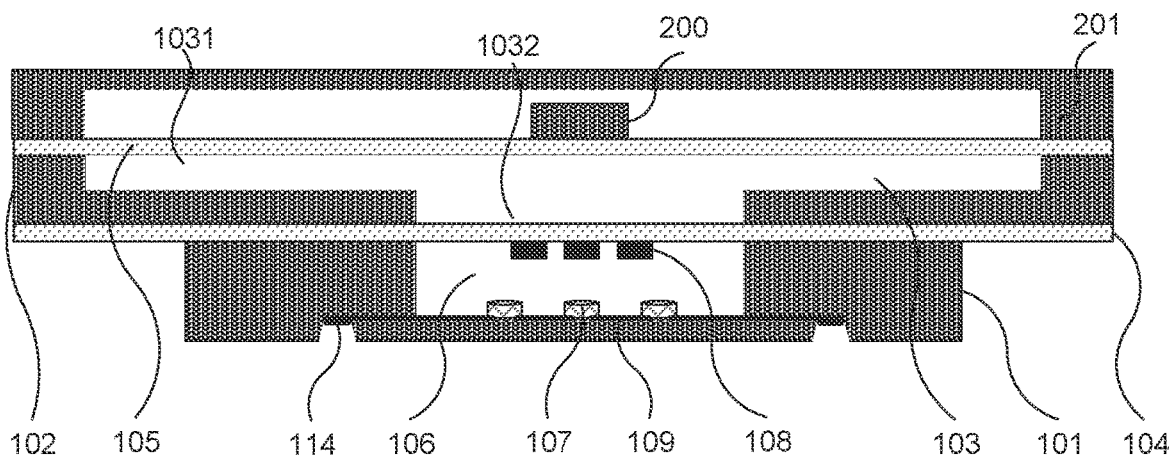
FIG. 14 is a schematic diagram of a cross-sectional structure of another MEMS environmental sensor according to an embodiment of the present invention.
Figure 15:
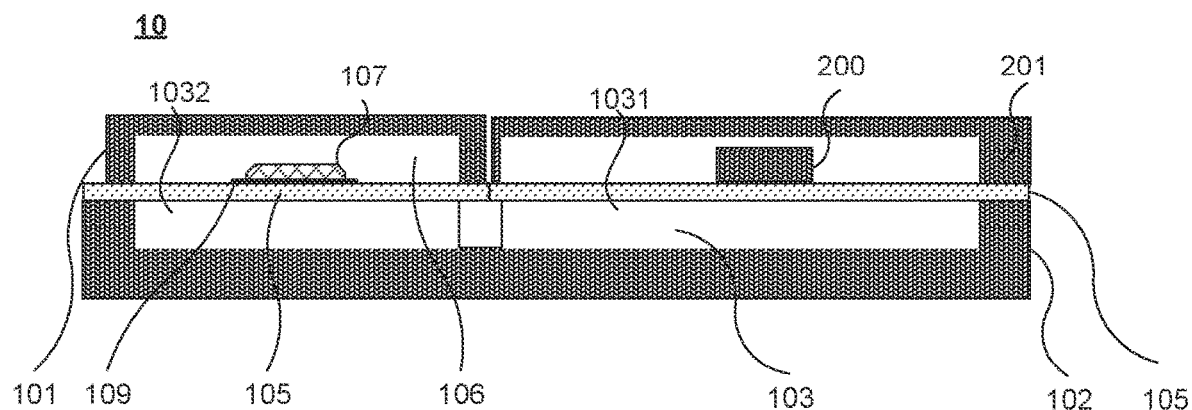
FIG. 15 is a schematic diagram of a cross-sectional structure of another MEMS environmental sensor according to an embodiment of the present invention.
Figure 16:
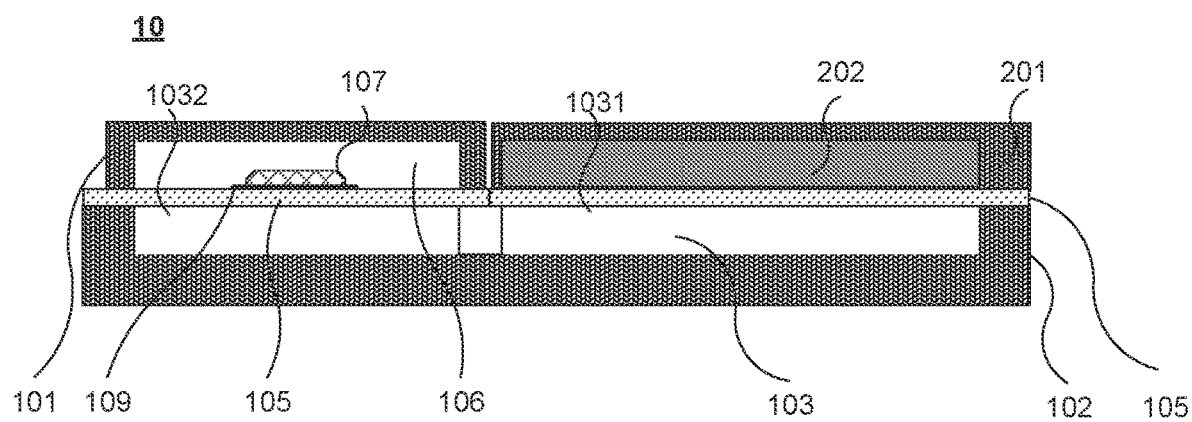
FIG. 16 is a schematic diagram of a cross-sectional structure of another MEMS environmental sensor according to an embodiment of the present invention.

On the basis of the above embodiments, FIG. 14 is a schematic diagram of a cross-sectional structure of another MEMS environmental sensor according to an embodiment of the present invention, FIG. 15 is a schematic diagram of a cross-sectional structure of another MEMS environmental sensor according to an embodiment of the present invention, and FIG. 16 is a schematic diagram of a cross-sectional structure of another MEMS environmental sensor according to an embodiment of the present invention. As shown in FIG. 14, FIG. 15, and FIG. 16, in the MEMS environmental sensor 10 provided by the embodiments of the present invention, a vacuum hood 201 is provided on the surface of one side of the elastic transfer membrane 105 away from the transfer cavity 103, the vacuum hood 201 and the elastic transfer membrane 105 form a sealed cavity, and the sealed cavity is a vacuum sealed cavity or a sealed cavity with a known reference pressure; a mass block 200 is provided inside the sealed cavity, and the mass block 200 is provided on the surface of the elastic transfer membrane 205; alternatively, the sealed cavity is filled with a counterweight liquid 202. Here, FIG. 14 takes the input port 1031 being located on the first surface of the transfer cavity 103 and the output port 1032 being located on the second surface of the transfer cavity 103 as an example for description, and FIG. 15 and FIG. 16 take the input port 1031 and the output port 1032 being both located on the second surface of the transfer cavity 103 as an example for description; at the same time, FIG. 14 and FIG. 15 take the mass block 200 being provided inside the sealed cavity as an example for description, and FIG. 16 takes the sealed cavity being filled with the counterweight liquid 202 as an example for description; furthermore, FIG. 15 and FIG. 16 take the magnetic sensing element 107 being a piezoelectric material or a dielectric material as an example for description. As shown in FIG. 14, FIG. 15, and FIG. 16, in order to improve the response of the elastic transfer membrane 105 to inertia parameters, the mass block 200 and the vacuum hood 201 may be provided above the elastic transfer membrane 105 as shown in FIG. 14 and FIG. 15; or the sealed cavity may be filled with the counterweight liquid 202 as shown in FIG. 16. The vacuum hood 201 has no contact with a projection region of the transfer cavity 103 on the elastic transfer membrane 105, and at the same time, the cavity formed by the vacuum hood 201 and the elastic transfer membrane 105 should be vacuum sealed or set to a known reference pressure, so as to eliminate the impact caused by external pressure changes, which ensures that the MEMS environmental sensor can realize the measurement of inertia parameters, and broadens the range of use of MEMS environmental sensor measurement.

As a feasible implementation, the MEMS environmental sensor 10 may further comprise a first passivation layer located on the surface of the magnetic sensing element 107 and a second passivation layer located on the surface of the magnetic film 108 (not shown) to enhance the encapsulation protection of the magnetic sensing element 107 and the magnetic film 108, improve the service life of the magnetic sensing element 107 and the magnetic film 108, and then improve the service life of the MEMS environmental sensor.

Figure 17:
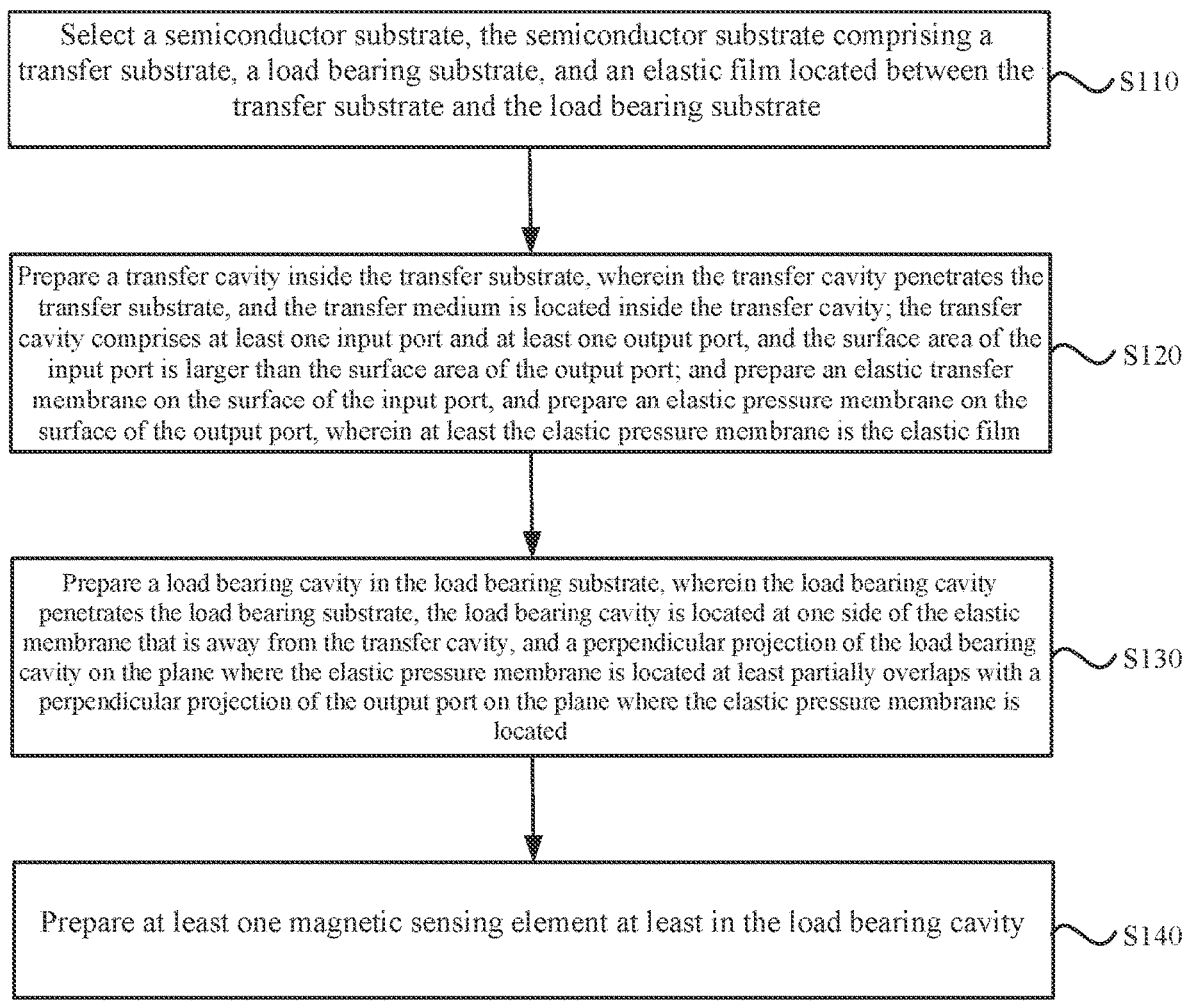
FIG. 17 is a flow chart of a preparation method for a MEMS environmental sensor according to an embodiment of the present invention.

On the basis of the same invention concept, the embodiments of the present invention further provide a preparation method for a MEMS environmental sensor, which is used for preparing the MEMS environmental sensor according to the above-described embodiments of the present invention. Specifically, FIG. 17 is a flow chart of a preparation method for a MEMS environmental sensor according to an embodiment of the present invention. As shown in FIG. 17, the preparation method for a MEMS environmental sensor according to an embodiment of the present invention comprises:

S110. Select a semiconductor substrate, the semiconductor substrate comprising a transfer substrate, a load bearing substrate, and an elastic film located between the transfer substrate and the load bearing substrate.

Illustratively, the semiconductor substrate may be an SOI semiconductor substrate, wherein the transfer substrate may be a top-layer silicon substrate in the SOI semiconductor substrate, the load bearing substrate may be a backing substrate in the SOI semiconductor substrate, and the elastic film may be an oxidation layer in the SOI semiconductor substrate; alternatively, the transfer substrate may be a backing substrate in the SOI semiconductor substrate, the load bearing substrate may be a top-layer silicon substrate in the SOI semiconductor substrate, and the elastic film may be an oxidation layer in the SOI semiconductor substrate.

S120. Prepare a transfer cavity inside the transfer substrate, wherein the transfer cavity penetrates the transfer substrate, and the transfer medium is located inside the transfer cavity; the transfer cavity comprises at least one input port and at least one output port, and the surface area of the input port is larger than the surface area of the output port; and prepare an elastic transfer membrane on the surface of the input port, and prepare an elastic pressure membrane on the surface of the output port, wherein at least the elastic pressure membrane is the elastic film.

Illustratively, an etching process is used to prepare a transfer cavity inside the transfer substrate by etching until the surface of the elastic film is reached, and the transfer cavity penetrates the transfer substrate. The transfer cavity comprises at least one input port and at least one output port, the surface area of the input port is larger than the surface area of the output port, and on the basis of the Pascal's principle, a difference in volume of the transfer cavity is used to transform a small displacement in a region of large volume into a large displacement in a region of small volume.

Furthermore, an elastic transfer membrane is prepared on the surface of the input port, and an elastic pressure membrane is prepared on the surface of the output port, wherein at least the elastic pressure membrane is the elastic film. For transfer cavities having different structures, the input port and the output port are set in different manners, and the elastic transfer membrane and the elastic pressure membrane are also set in different manners, which will be described later.

S130. Prepare a load bearing cavity in the load bearing substrate, wherein the load bearing cavity penetrates the load bearing substrate, the load bearing cavity is located at one side of the elastic membrane that is away from the transfer cavity, and a perpendicular projection of the load bearing cavity on the plane where the elastic pressure membrane is located at least partially overlaps with a perpendicular projection of the output port on the plane where the elastic pressure membrane is located.

Illustratively, an etching process is used to prepare a load bearing cavity inside the load bearing substrate by similarly etching until the surface of the elastic film is reached to obtain the load bearing cavity, wherein the load bearing cavity is located at one side of the elastic membrane that is away from the transfer cavity, and a perpendicular projection of the load bearing cavity on the plane where the elastic pressure membrane is located at least partially overlaps with a perpendicular projection of the output port on the plane where the elastic pressure membrane is located. In this way, the large displacement can be transmitted to the load bearing cavity.

S140. Prepare at least one magnetic sensing element at least in the load bearing cavity.

By preparing at least one magnetic sensing element at least in the load bearing cavity, it is ensured that a change in displacement can be converted, through an intermediate variable, such as a change in magnetic field, into a change in electrical resistance. Meanwhile, by means of the characteristics of the magnetic sensing element, i.e., high sensitivity and low power consumption, sensors for environmental parameters, such as environmental temperature, pressure, displacement, vibration, and acoustic wave, are prepared on a single chip using the same process, which facilitates the integration and miniaturization of environmental sensors while ensuring the high signal-to-noise ratio and low power consumption of the sensors.

In summary, according to the preparation method for a MEMS environmental sensor provided by the embodiments of the present invention, the transfer cavity is prepared inside the transfer substrate, and the surface area of the input port in the transfer cavity is further prepared to be larger than the surface area of the output port; on the basis of the Pascal's principle, a difference in volume of the transfer cavity is used to transform a small displacement in a region of large volume into a large displacement in a region of small volume; at the same time, a perpendicular projection of the load bearing cavity on the plane where the elastic pressure membrane is located is set to at least partially overlap with a perpendicular projection of the output port on the plane where the elastic pressure membrane is located, which transmits the large displacement to the load bearing cavity, and since the multi-component highly sensitive material is prepared as a magnetic sensing element in the load bearing cavity, the change in displacement can thus be converted, through an intermediate variable, such as a change in magnetic field, into a change in electrical resistance; and by means of the characteristics of the magnetic sensing element, i.e., high sensitivity and low power consumption, sensors for environmental parameters, such as pressure, displacement, vibration, and acoustic wave, are prepared on a single chip using the same process, which facilitates the integration and miniaturization of environmental sensors while ensuring the high signal-to-noise ratio and low power consumption of the sensors.

Optionally, the MEMS environmental sensors provided in the embodiments of the present invention may include two different structures, wherein the transfer cavity may comprise a first surface and a second surface that are provided to oppose each other. In one of the structures, the input port is located on the first surface of the transfer cavity, and the output port is located on the second surface of the transfer cavity, that is, the input port and the output port are located on different surfaces of the transfer cavity, and the input port and the output port are stacked. In the other structure, the input port and the output port are both located on the second surface of the transfer cavity, and the first surface of the transfer cavity is a rigid bottom surface. Preparation methods are also different for the different structures. In combination with actual preparation processes, the preparation methods for the MEMS environmental sensors having two different structures will be described in detail below.

First, the description is provided by taking the following as an example: the transfer cavity comprises a first surface and a second surface that are provided to oppose each other, the input port is located on the first surface of the transfer cavity, and the output port is located on the second surface of the transfer cavity, that is, the input port and the output port are located on different surfaces of the transfer cavity.

Figure 18:
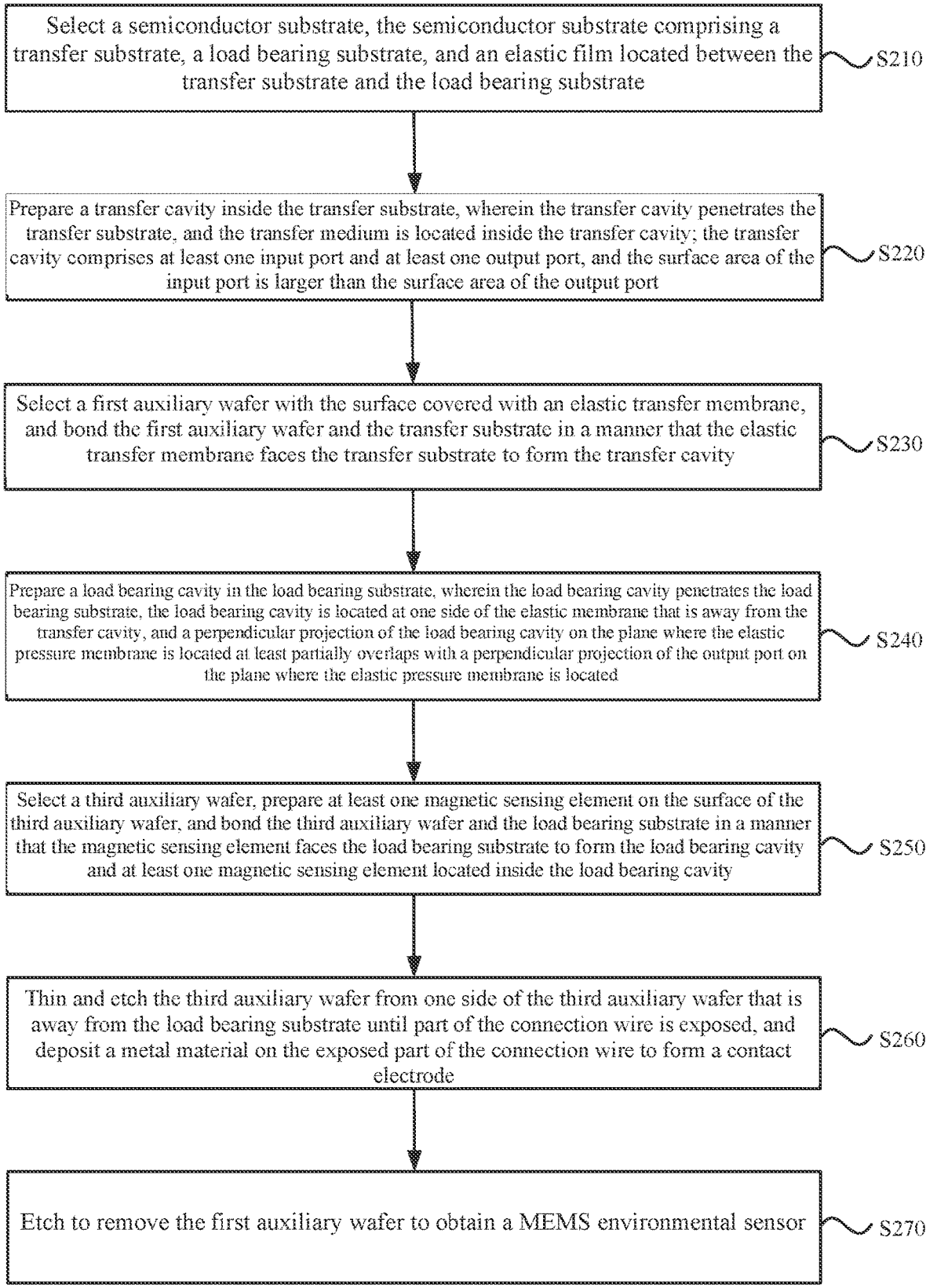
FIG. 18 is a flow chart of a preparation method for another MEMS environmental sensor according to an embodiment of the present invention.

FIG. 18 is a flow chart of a preparation method for another MEMS environmental sensor according to an embodiment of the present invention, and as shown in FIG. 18, the preparation method for a MEMS environmental sensor according to the embodiment of the present invention may comprise:

S210. Select a semiconductor substrate, the semiconductor substrate comprising a transfer substrate, a load bearing substrate, and an elastic film located between the transfer substrate and the load bearing substrate.

Figure 19:
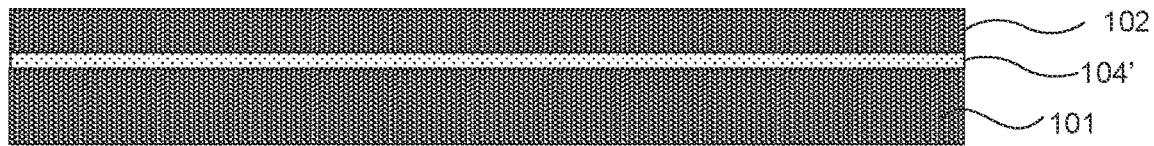
FIG. 19 through FIG. 28 are specific preparation processes of all steps in the preparation method corresponding to FIG. 18.

As shown in FIG. 19, the semiconductor substrate comprises a transfer substrate 102, a load bearing substrate 101, and an elastic film 104' located between the transfer substrate 102 and the load bearing substrate 101.

S220. Prepare a transfer cavity inside the transfer substrate, wherein the transfer cavity penetrates the transfer substrate, and the transfer medium is located inside the transfer cavity; the transfer cavity comprises at least one input port and at least one output port, and the surface area of the input port is larger than the surface area of the output port.

Figure 20:
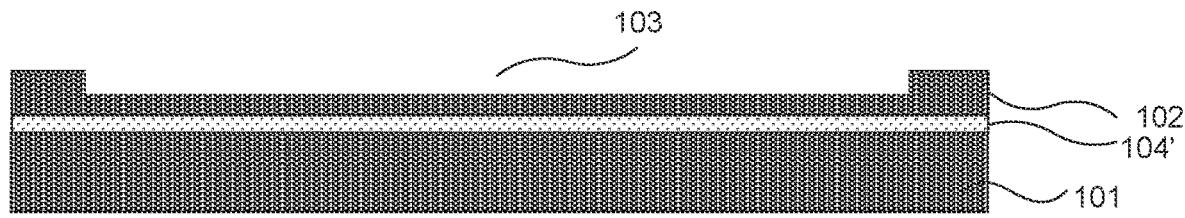
Figure 21:
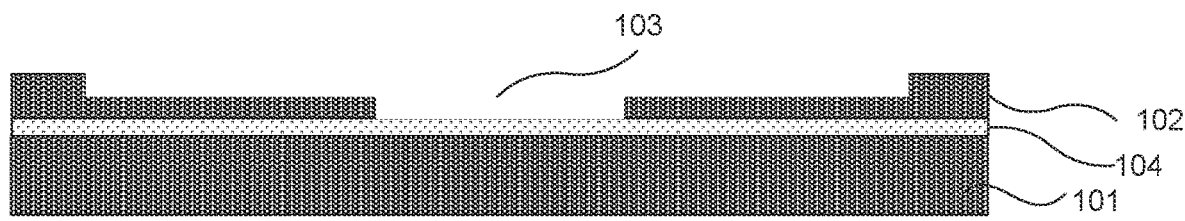

As shown in FIG. 20 and FIG. 21, first, the transfer substrate 102 is partially etched at one side of the transfer substrate 102 that is away from the load bearing substrate 101, to obtain a transfer port 1031 that has a relatively large port area; then, the etching of the transfer substrate 102 is continued until the etching reaches the surface of the elastic film 014, to obtain an output port 1032 that has a relatively small port area and the transfer cavity 103 with a complete structure. At this point, the elastic film 104' is the elastic pressure film 104.

S230. Select a first auxiliary wafer with the surface covered with an elastic transfer membrane, and bond the first auxiliary wafer and the transfer substrate in a manner that the elastic transfer membrane faces the transfer substrate to form the transfer cavity.

Figure 22:
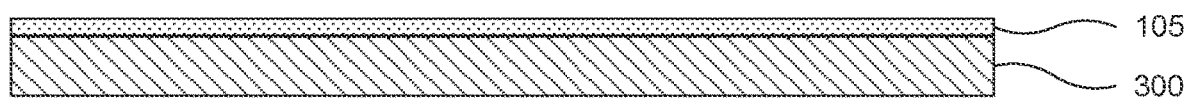
Figure 23:
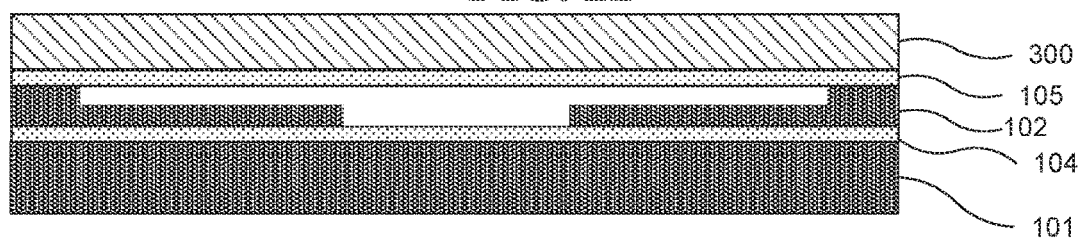

As shown in FIG. 22 and FIG. 23, first, a first auxiliary wafer 300 with the surface covered with air elastic transfer membrane 105 is selected, and then, the first auxiliary wafer 300 and the transfer substrate 102 are bonded in a manner that the elastic transfer membrane 105 faces the transfer substrate 102 to form the transfer cavity 103 and the elastic transfer film 105 located on the surface of the transfer port 1031.

S240. Prepare a load bearing cavity in the load bearing substrate, wherein the load bearing cavity penetrates the load bearing substrate, the load bearing cavity is located at one side of the elastic membrane that is away from the transfer cavity, and a perpendicular projection of the load bearing cavity on the plane where the elastic pressure membrane is located at least partially overlaps with a perpendicular projection of the output port on the plane where the elastic pressure membrane is located.

Figure 24:
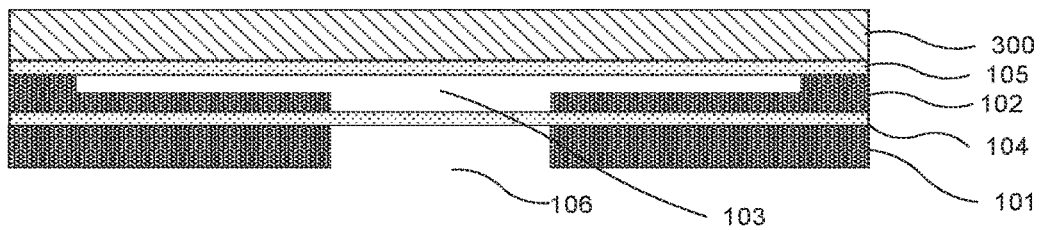

As shown in FIG. 24, the load bearing substrate 101 is etched from one side of the load bearing substrate 101 that is away from the transfer substrate 102 until the etching reaches the elastic pressure film 104, to obtain the load bearing cavity 106 that penetrates the load bearing substrate 101, the load bearing cavity 106 is located at one side of the elastic pressure membrane 104 that is away from the transfer cavity 103, and a perpendicular projection of the load bearing cavity 106 on the plane where the elastic pressure membrane 104 is located at least partially overlaps with a perpendicular projection of the output port 1032 on the plane where the elastic pressure membrane 104 is located. In this way, the large displacement can be transmitted to the load bearing cavity 106.

S250. Select a third auxiliary wafer, prepare at least one magnetic sensing element on the surface of the third auxiliary water, and bond the third auxiliary wafer and the load bearing substrate in a manner that the magnetic sensing element faces the load bearing substrate to form the load bearing cavity and at least one magnetic sensing element located inside the load bearing cavity.

Figure 25:
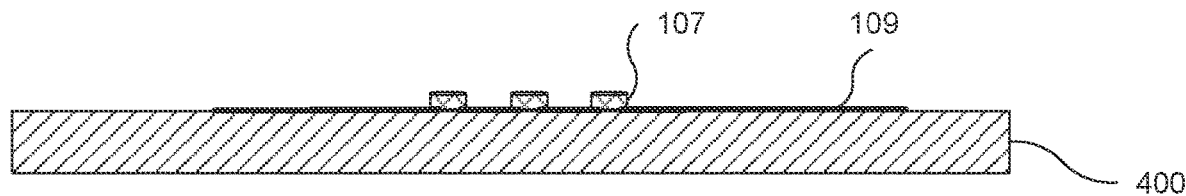

As shown in FIG. 25, a third auxiliary wafer 400 is selected, a sensing material film is deposited on the surface of the third auxiliary wafer 400, and a magnetic sensing element 107 and a connection wire 109 are formed through photolithography.

Figure 26:
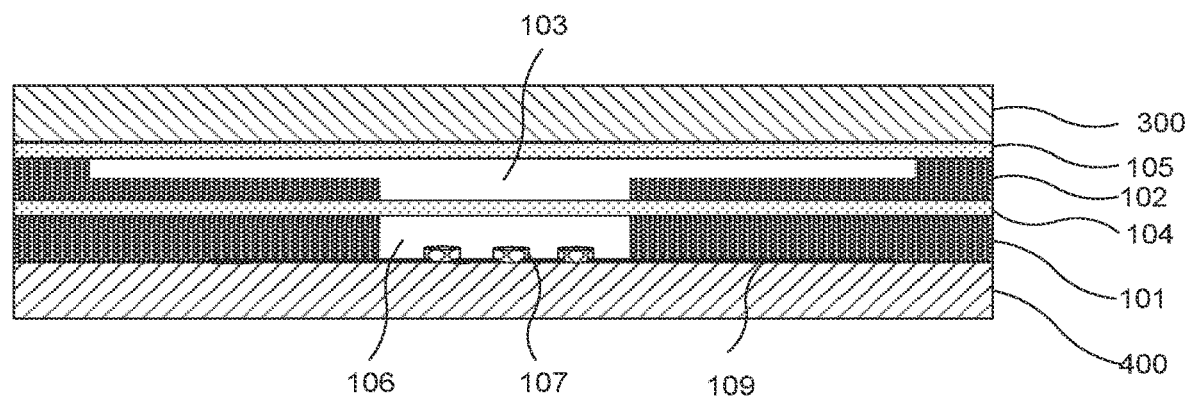

As shown in FIG. 26, the third auxiliary water 400 and the load bearing substrate 101 are bonded in a manner that the magnetic sensing element 107 faces the load bearing substrate 101 to form the load bearing cavity 106 and at least one magnetic sensing element 107 located inside the load bearing cavity 106.

S260. Thin and etch the third auxiliary wafer from one side of the third auxiliary wafer that is away from the load bearing substrate until part of the connection wire is exposed, and deposit a metal material on the exposed part of the connection wire to form a contact electrode.

Figure 27:
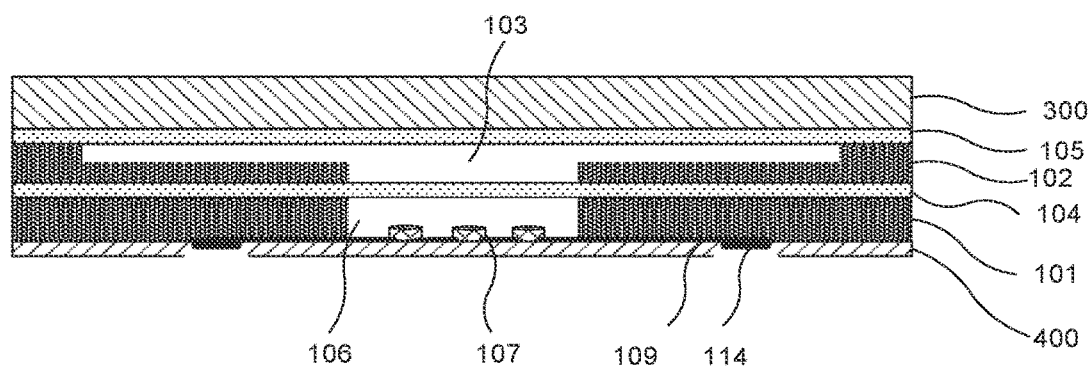

As shown in FIG. 27, the third auxiliary wafer 400 is thinned and etched from one side of the third auxiliary wafer 400 that is away from the load bearing substrate 101 until part of the connection wire 109 is exposed, and a metal material is deposited on the exposed part of the connection wire 109 to form a contact electrode 114.

In this way, a MEMS environmental sensor capable of measuring environmental temperature is obtained.

S270. Etch to remove the first auxiliary wafer to obtain a MEMS environmental sensor.

Figure 28:
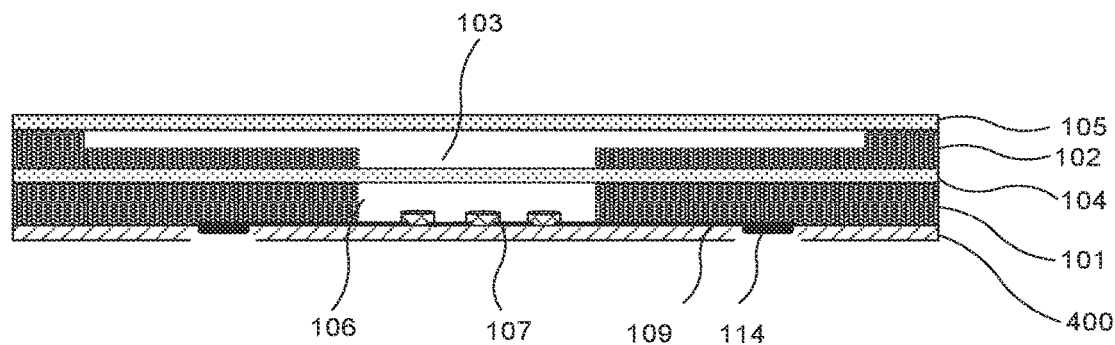

As shown in FIG. 28, the first auxiliary wafer 300 is removed to obtain a MEMS environmental sensor, and the MEMS environmental sensor at this point can perform measurements of environmental parameters such as pressure, displacement, vibration, and acoustic wave.

Subsequently, the description is provided by taking the following as an example: the transfer cavity comprises a first surface and a second surface that are provided to oppose each other, the input port and the output port are both located on the second surface of the transfer cavity, and the first surface of the transfer cavity is a rigid bottom surface, that is, the input port and the output port are located on the same surface of the transfer cavity.

Figure 29:
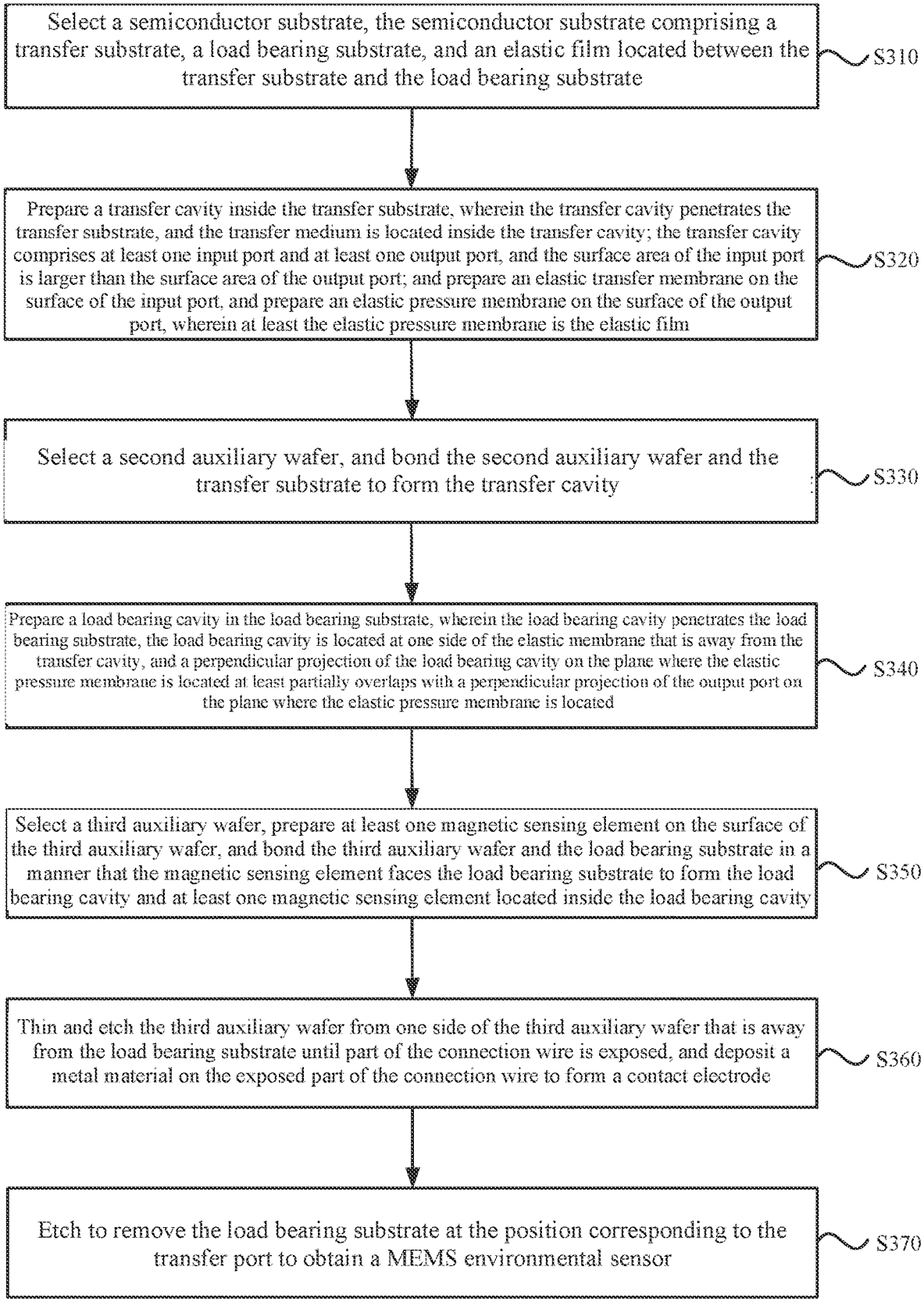
FIG. 29 is a flow chart of a preparation method for another MEMS environmental sensor according to an embodiment of the present invention.

FIG. 29 is a flow chart of a preparation method for another MEMS environmental sensor according to an embodiment of the present invention, and as shown in FIG. 29, the preparation method for a MEMS environmental sensor according to the embodiment of the present invention may comprise:

S310. Select a semiconductor substrate, the semiconductor substrate comprising a transfer substrate, a load bearing substrate, and an elastic film located between the transfer substrate and the load bearing substrate.

Continuing to refer to FIG. 19, the semiconductor substrate comprises the transfer substrate 102, the load bearing substrate 101, and the elastic film 104' located between the transfer substrate 102 and the load bearing substrate 101.

S320. Prepare a transfer cavity inside the transfer substrate, wherein the transfer cavity penetrates the transfer substrate, and the transfer medium is located inside the transfer cavity; the transfer cavity comprises at least one input port and at least one output port, and the surface area of the input port is larger than the surface area of the output port; and prepare an elastic transfer membrane on the surface of the input port, and prepare an elastic pressure membrane on the surface of the output port, wherein at least the elastic pressure membrane is the elastic film.

Figure 30:
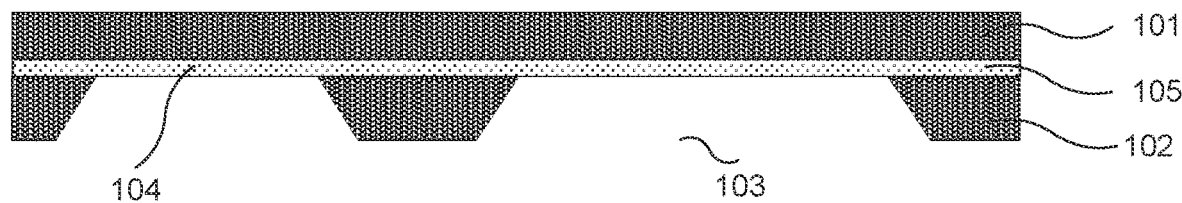
FIG. 30 through FIG. 37 are specific preparation processes of all the steps in the preparation method corresponding to FIG. 29.

As shown in FIG. 30, the transfer substrate 102 is etched at one side of the transfer substrate 102 that is away from the load bearing substrate 101, to obtain the transfer cavity 103. At this point, the elastic pressure membrane 105 is the elastic film 104', and the elastic pressure membrane 104 is the elastic film 104'.

S330. Select a second auxiliary wafer, and bond the second auxiliary wafer and the transfer substrate to form the transfer cavity.

Figure 31:
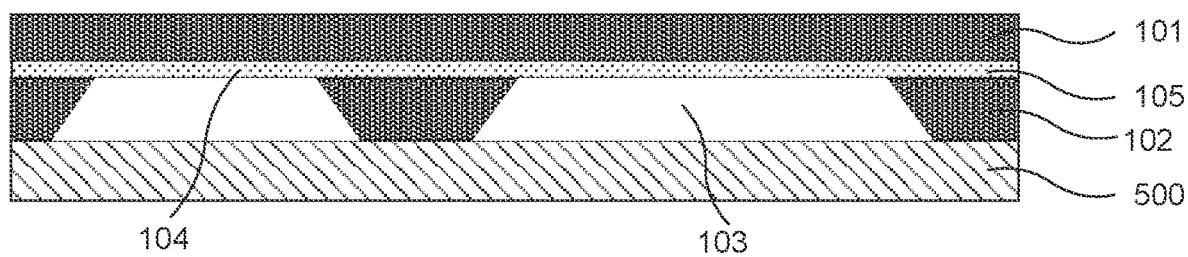

As shown in FIG. 31, a second auxiliary wafer 500 is selected, and the second auxiliary wafer 500 and the transfer substrate 102 are bonded to form the transfer cavity 103.

Figure 32:
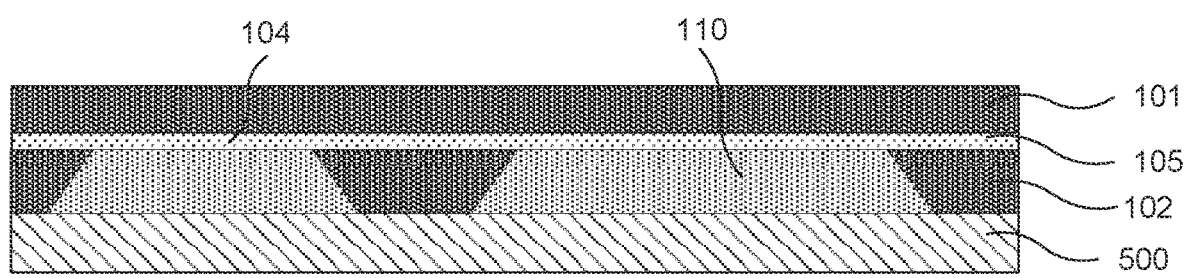

As shown in FIG. 32, the transfer cavity 103 is filled with a transfer medium.

S340. Prepare a load bearing cavity in the load bearing substrate, wherein the load bearing cavity penetrates the load bearing substrate, the load bearing cavity is located at one side of the elastic membrane that is away from the transfer cavity, and a perpendicular projection of the load bearing cavity on the plane where the elastic pressure membrane is located at least partially overlaps with a perpendicular projection of the output port on the plane where the elastic pressure membrane is located.

Figure 33:
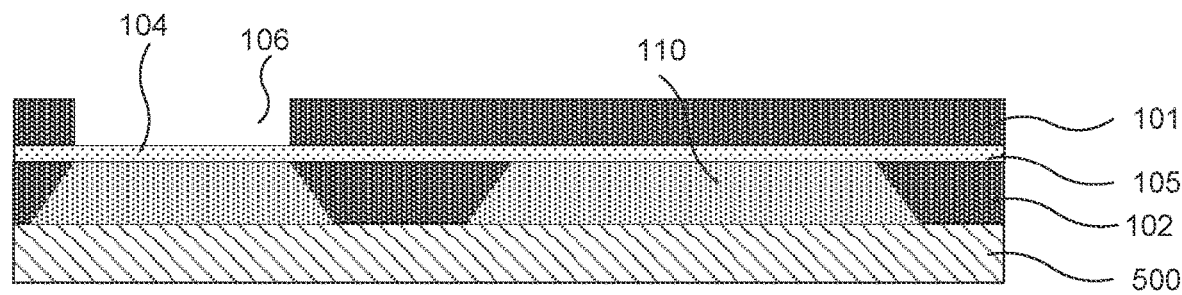

As shown in FIG. 33, the load bearing substrate 101 is etched from one side of the load bearing substrate 101 that is away from the transfer substrate 102 until the etching reaches the elastic pressure film 104, to obtain the load bearing cavity 106 that penetrates the load bearing substrate 101, the load bearing cavity 106 is located at one side of the elastic pressure membrane 104 that is away from the transfer cavity 103, and a perpendicular projection of the load bearing cavity 106 on the plane where the elastic pressure membrane 104 is located at least partially overlaps with a perpendicular projection of the output port 1032 on the plane where the elastic pressure membrane 104 is located. In this way, the large displacement can be transmitted to the load bearing cavity 106.

S350. Select a third auxiliary wafer, prepare at least one magnetic sensing element on the surface of the third auxiliary wafer, and bond the third auxiliary wafer and the load bearing substrate in a manner that the magnetic sensing element faces the load bearing substrate to form the load bearing cavity and at least one magnetic sensing element located inside the load bearing cavity.

Continuing to refer to FIG. 25, the third auxiliary wafer 400 is selected, a sensing material film is deposited on the surface of the third auxiliary wafer 400, and the magnetic sensing element 107 and the connection wire 109 are formed through photolithography.

Figure 34:
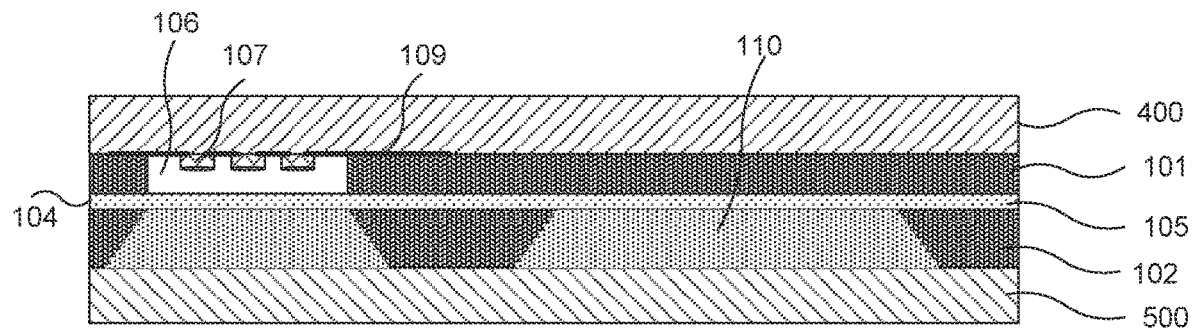

As shown in FIG. 34, the third auxiliary wafer 400 and the load bearing substrate 101 are bonded in a manner that the magnetic sensing element 107 faces the load bearing substrate 101 to form the load bearing cavity 106 and at least one magnetic sensing element 107 located inside the load bearing cavity 106.

S360. Thin and etch the third auxiliary wafer from one side of the third auxiliary wafer that is away from the load bearing substrate until part of the connection wire is exposed, and deposit a metal material on the exposed part of the connection wire to form a contact electrode.

Figure 35:
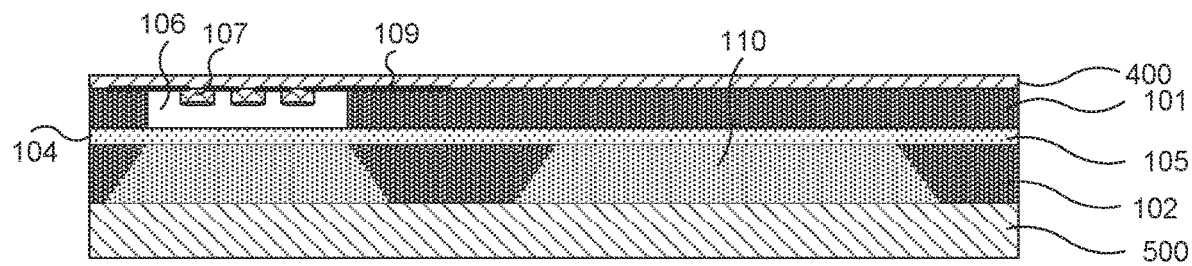

As shown in FIG. 35, the third auxiliary wafer 400 is thinned from one side of the third auxiliary wafer 400 that is away from the load bearing substrate 101.

Figure 36:
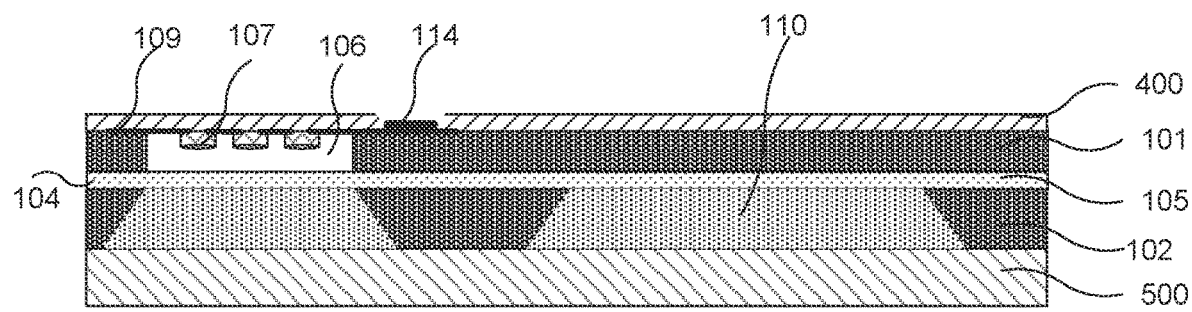

As shown in FIG. 36, the third auxiliary wafer 400 is etched until part of the connection wire 109 is exposed, and a metal material is deposited on the exposed part of the connection wire 109 to form a contact electrode 114.

In this way, a MEMS environmental sensor capable of measuring environmental temperature is obtained.

S370. Etch to remove the load bearing substrate at the position corresponding to the transfer port to obtain a MEMS environmental sensor.

Figure 37:
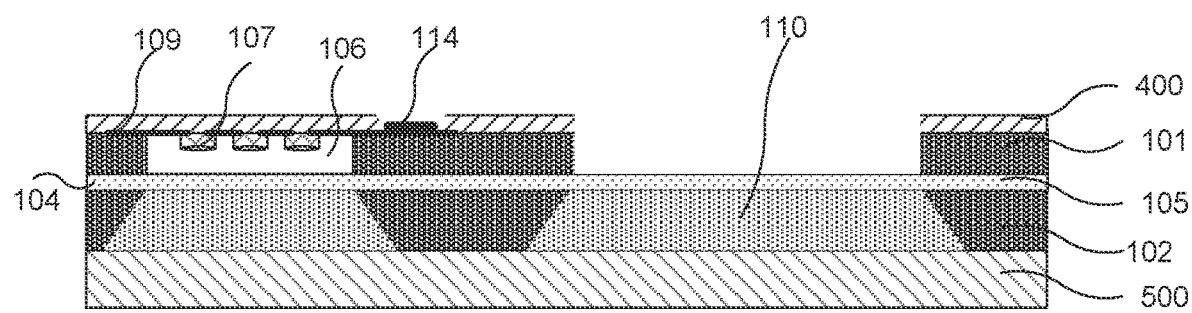

As shown in FIG. 37, the load bearing substrate 101 and the third auxiliary wafer 400 at the position corresponding to the transfer port are removed to obtain a MEMS environmental sensor, and the MEMS environmental sensor at this point can perform measurements of environmental parameters such as pressure, displacement, vibration, and acoustic wave.

In summary, the above embodiments describe in detail the preparation methods for the MEMS environmental sensors having two different structures from the angle of actual preparation processes.

On the basis of the above embodiments, the preparation methods for the MEMS environmental sensors provided in the embodiments of the present invention further comprise preparing a signal converting material.

Specifically, the signal converting material comprises a magnetic material; and preparing the signal converting material may comprise preparing a magnetic material inside the transfer cavity or on the surface of the elastic pressure membrane, wherein the magnetic material is uniformly dispersed in a particulate form inside the transfer medium or disposed in a film form on the surface of the elastic pressure membrane facing the transfer cavity and/or on the surface of one side of the elastic pressure membrane facing the load bearing cavity.

Alternatively, the signal converting material comprises a non-magnetic metal material and a laser coil; and preparing the signal converting material may comprise preparing a non-magnetic metal material inside the transfer cavity or on the surface of the elastic pressure membrane, wherein the non-magnetic metal material is uniformly dispersed in a particulate form inside the transfer medium or disposed in a film form on the surface of the elastic pressure membrane facing the transfer cavity and/or on the surface of one side of the elastic pressure membrane facing the load bearing cavity; and preparing an excitation coil inside the load bearing cavity, wherein a radio frequency alternating current is loaded in the excitation coil and used for driving the non-magnetic metal material to produce an induced eddy current, thereby producing an induced magnetic field.

In the MEMS environmental sensor according to the embodiments of the present invention, the signal converting material may comprise different forms, and correspondingly, the preparation methods also correspond to different processes. By adding the signal converting material, the amplitude of the change to the intermediate variable is increased, and the sensitivity of the MEMS environmental sensor is improved.

On the basis of the above embodiments, the preparation methods for the MEMS environmental sensors provided in the embodiments of the present invention further comprise preparing a mass block and a vacuum hood on one side of the elastic transfer membrane away from the transfer cavity, wherein the vacuum hood and the elastic transfer membrane form a sealed cavity, the sealed cavity is a vacuum sealed cavity or a sealed cavity a known reference pressure, and the mass block is provided inside the sealed cavity; alternatively, preparing the vacuum hood on one side of the elastic transfer membrane away from the transfer cavity, wherein the vacuum hood and the elastic transfer membrane form a sealed cavity, the sealed cavity is a vacuum sealed cavity or a sealed cavity with a known reference pressure, and the sealed cavity is filled with a counterweight liquid. By means of the provided vacuum hood and providing a mass block or a counterweight liquid in the vacuum hood, it is ensured that the MEMS environmental sensor can realize the measurement of inertia parameters, and the range of use of MEMS environmental sensor measurement is broadened.

On the basis of the above embodiments, after preparing at least one magnetic sensing element at least in the load bearing cavity, the preparation methods for the MEMS environmental sensors provided in the embodiments of the present invention may further comprise preparing a first passivation layer on the surface of the magnetic sensing element; and preparing a magnetic film on the surface of one side of the elastic pressure membrane facing the transfer cavity, and/or after preparing the magnetic film on the surface of one side of the elastic pressure membrane facing the load bearing cavity, may further comprise preparing a second passivation layer on the surface of the magnetic film. By respectively preparing a passivation layer on the surfaces of the magnetic sensing element and the magnetic film, the encapsulation protection of the magnetic sensing element and the magnetic film is enhanced through the passivation layers, which improves the service life of the magnetic sensing element and the magnetic film, and then improves the service life of the MEMS environmental sensor.

It should be noted that the foregoing is merely preferred embodiments and employed technical principles of the present invention. Those skilled in the art should appreciate that the present invention is not limited to the specific embodiments described herein, and features of various implementations of the present invention may be partially or wholly coupled or combined with each other, and may cooperate with and be technically driven by each other in various manners. Various obvious changes, re-adjustments, mutual combinations, and substitutions may be made by those skilled in the art without departing from the protection scope of the present invention. Therefore, although the present invention is described in detail through the above embodiments, the present invention is not, limited only to the above embodiments. More other equivalent embodiments may be further encompassed without departing from the concept of the present invention, while the scope of the present invention shall be subject to the scope of the appended claims.

The invention claimed is:

1. A MEMS environmental sensor, comprising a transfer substrate, a transfer medium, a load bearing substrate, and at least one magnetic sensing element;

wherein a transfer cavity is provided inside the transfer substrate, the transfer cavity penetrates the transfer substrate, and the transfer medium is located inside the transfer cavity; the transfer cavity comprises at least one input port and at least one output port, and a surface area of the input port is larger than a surface area of the output port;

an elastic transfer membrane is provided on the surface of the input port, and an elastic pressure membrane is provided on the surface of the output port;

a load bearing cavity is provided in the load bearing substrate, the load bearing cavity penetrates the load bearing substrate, and the magnetic sensing element is at least positioned inside the load bearing cavity; and the load bearing cavity is located at one side of the elastic pressure membrane that is away from the transfer cavity, and a perpendicular projection of the load bearing cavity on a plane where the elastic pressure membrane is located at least partially overlaps with a perpendicular projection of the output port on the plane where the elastic pressure membrane is located, wherein a rigid covering layer is provided on a surface of one side of the elastic transfer membrane away from the transfer cavity; or a vacuum hood is provided on one side of the elastic transfer membrane away from the transfer cavity, the vacuum hood and the elastic transfer membrane form a sealed cavity, and the sealed cavity is a vacuum sealed cavity or a sealed cavity with a known reference pressure, and a mass block is provided inside the sealed cavity, and the mass block is provided on the surface of the elastic transfer membrane; alternatively, the sealed cavity is filled with a counterweight liquid.

2. The MEMS environmental sensor according to claim 1, wherein the transfer cavity comprises a first surface and a second surface that are provided to oppose each other, the input port is located on the first surface of the transfer cavity, and the output port is located on the second surface of the transfer cavity; alternatively, the input port and the output port are both located on the second surface of the transfer cavity, and the first surface of the transfer cavity is a rigid bottom surface;

the load bearing cavity comprises a third surface and a fourth surface that are provided to oppose each other, the third surface is attached to the elastic pressure membrane, and the fourth surface is a rigid bottom surface.

3. The MEMS environmental sensor according to claim 2, wherein the magnetic sensing element is provided on the fourth surface of the load bearing cavity; and the magnetic sensing element is also provided on the first surface of the transfer cavity, a surface of one side of the elastic pressure membrane facing the load bearing cavity, or a surface of one side of the elastic pressure membrane facing the transfer cavity.

4. The MEMS environmental sensor according to claim 3, wherein the magnetic sensing element is provided on the fourth surface of the load bearing cavity; and the MEMS environmental sensor further comprises a connection wire and a contact electrode disposed on one side of the magnetic sensing element that is away from the elastic pressure membrane, the connection wire is electrically connected with the magnetic sensing element, and the contact electrode is electrically connected with the connection wire.

5. The MEMS environmental sensor according to claim 2, wherein the first surface and the second surface are parallel to each other and are both parallel to the plane where a surface of the transfer substrate is located; and the third surface and the fourth surface are parallel to each other and are both parallel to the plane where the surface of the load bearing substrate is located.

6. The MEMS environmental sensor according to claim 1, wherein the MEMS environmental sensor further comprises a signal converting material, at least part of the signal converting material is uniformly dispersed in a particulate form inside the transfer medium, or at least part of the signal converting material is disposed in a film form on the surface of the elastic pressure membrane.

7. The MEMS environmental sensor according to claim 6, wherein the signal converting material comprises a magnetic material, the magnetic material is uniformly dispersed in a particulate form inside the transfer medium or disposed in a film form on the surface of one side of the elastic pressure membrane facing the transfer cavity and/or on the surface of one side of the elastic pressure membrane facing the load bearing cavity;

alternatively, the signal converting material comprises a non-magnetic metal material and an excitation coil, and the non-magnetic metal material is uniformly dispersed in a particulate form inside the transfer medium or disposed in a film form on the surface of one side of the elastic pressure membrane facing the transfer cavity and/or on the surface of one side of the elastic pressure membrane facing the load bearing cavity, the excitation coil is provided inside the load bearing cavity; a radio frequency alternating current is loaded in the excitation coil and used for driving the non-magnetic metal material to produce an induced eddy current, thereby producing an induced magnetic field.

8. The MEMS environmental sensor according to claim 7, wherein the MEMS environmental sensor further comprises a first passivation layer located on the surface of the magnetic sensing element and a second passivation layer located on the surface of the magnetic film.

9. The MEMS environmental sensor according to claim 1, wherein the rigid covering layer is provided on the surface of the one side of the elastic transfer membrane away from the transfer cavity.

10. The MEMS environmental sensor according to claim 1, wherein the vacuum hood is provided on the one side of the elastic transfer membrane away from the transfer cavity, the vacuum hood and the elastic transfer membrane form the sealed cavity, and the sealed cavity is the vacuum sealed cavity or the sealed cavity with the known reference pressure; and the mass block is provided inside the sealed cavity, and the mass block is provided on the surface of the elastic transfer membrane; alternatively, the sealed cavity is filled with the counterweight liquid.

11. The MEMS environmental sensor according to claim 1, wherein the magnetic sensing element comprises one of anisotropic magnetoresistance, giant magnetoresistance, tunnel junction magnetoresistance, Hall element, piezoelectric material, or dielectric material.

12. A preparation method for a MEMS environmental sensor, used for preparing a MEMS environmental sensor according to claim 1, wherein the preparation method comprises:

selecting a semiconductor substrate, the semiconductor substrate comprising a transfer substrate, a load bearing substrate, and an elastic film located between the transfer substrate and the load bearing substrate;

preparing a transfer cavity inside the transfer substrate, wherein the transfer cavity penetrates the transfer substrate, and a transfer medium is located inside the transfer cavity; the transfer cavity comprises at least one input port and at least one output port, and a surface area of the input port is larger than a surface area of the output port;

preparing an elastic transfer membrane on the surface of the input port, and preparing an elastic pressure membrane on the surface of the output port, with at least the elastic pressure membrane being the elastic film;

preparing a load bearing cavity in the load bearing substrate, wherein the load bearing cavity penetrates the load bearing substrate, the load bearing cavity is located at one side of the elastic membrane that is away from the transfer cavity, and a perpendicular projection of the load bearing cavity on a plane where the elastic pressure membrane is located at least partially overlaps with a perpendicular projection of the output port on the plane where the elastic pressure membrane is located; and preparing at least one magnetic sensing element at least in the load bearing cavity, wherein the preparation method further comprises providing a rigid covering layer on a surface of one side of the elastic transfer membrane away from the transfer cavity; or providing a vacuum hood on one side of the elastic transfer membrane away from the transfer cavity, the vacuum hood and the elastic transfer membrane form a sealed cavity, and the sealed cavity is a vacuum sealed cavity or a sealed cavity with a known reference pressure, and providing a mass block inside the sealed cavity and on the surface of the elastic transfer membrane; alternatively, the sealed cavity is filled with a counterweight liquid.

13. The preparation method according to claim 12, wherein the transfer cavity comprises a first surface and a second surface that are provided to oppose each other, the input port is located on the first surface of the transfer cavity, and the output port is located on the second surface of the transfer cavity;
- the preparing an elastic transfer membrane on the surface of the input port, and preparing an elastic pressure membrane on the surface of the output port, with at least the elastic pressure membrane being the elastic film comprises:
- selecting a first auxiliary wafer with the surface covered with an elastic transfer membrane, and bonding the first auxiliary wafer and the transfer substrate in a manner that the elastic transfer membrane faces the transfer substrate to form the transfer cavity; and
- the elastic pressure membrane being the elastic film; and the preparation method further comprises:
- etching to remove the first auxiliary wafer to obtain a MEMS environmental sensor.

14. The preparation method according to claim 12, wherein the transfer cavity comprises a first surface and a second surface that are provided to oppose each other, the input port and the output port are both located on the second surface of the transfer cavity, and the first surface of the transfer cavity is a rigid bottom surface;
- the preparing an elastic transfer membrane on the surface of the input port, and preparing an elastic pressure membrane on the surface of the output port, with at least the elastic pressure membrane being the elastic film comprises:
- the elastic transfer membrane being the elastic film, and the elastic pressure membrane being the elastic film;
- before preparing a load bearing cavity in the load bearing substrate, the preparation method further comprises:
- selecting a second auxiliary wafer, and bonding the second auxiliary wafer and the transfer substrate to form the transfer cavity; and
- the preparation method further comprises:
- etching to remove the load bearing substrate at a position corresponding to the transfer port to obtain a MEMS environmental sensor.

15. The preparation method according to claim 12, wherein the preparing at least one magnetic sensing element at least in the load bearing cavity comprises:
- selecting a third auxiliary wafer, preparing at least one magnetic sensing element on the surface of the third auxiliary wafer, and bonding the third auxiliary wafer and the load bearing substrate in a manner that the magnetic sensing element faces the load bearing substrate to form the load bearing cavity and at least one magnetic sensing element located inside the load bearing cavity.

16. The preparation method according to claim 15, wherein the preparing at least one magnetic sensing element on the surface of the third auxiliary wafer comprises:
- depositing a sensing material film on the surface of the third auxiliary wafer, and forming a magnetic sensing element and a connection wire through photolithography; and
- after forming the load bearing cavity and at least one magnetic sensing element located inside the load bearing cavity, the preparation method further comprises:
- thinning and etching the third auxiliary wafer from one side of the third auxiliary wafer that is away from the load bearing substrate until part of the connection wire is exposed, and depositing a metal material on the exposed part of the connection wire to form a contact electrode.

* * * * *

UNITED STATES PATENT AND TRADEMARK OFFICE
CERTIFICATE OF CORRECTION

PATENT NO. : 12,319,565 B2  
APPLICATION NO. : 17/996425  
DATED : June 3, 2025  
INVENTOR(S) : Jin et al.

Page 1 of 1

It is certified that error appears in the above-identified patent and that said Letters Patent is hereby corrected as shown below:

In the Claims

In Column 18, Line 32, in Claim 1, after "cavity;", insert a linebreak

In Column 18, Line 42, in Claim 1, after "and", insert a linebreak

In Column 18, Line 61, in Claim 1, after "membrane;", insert a linebreak

In Column 19, Line 2, in Claim 2, after "cavity;", insert a linebreak

In Column 19, Line 60, in Claim 7, after "cavity;", insert a linebreak

In Column 20, Line 17, in Claim 10, after "membrane;", insert a linebreak

In Column 20, Lines 25-26, in Claim 12, delete "sensor according to claim 1," and insert --sensor,-- therefor In Column 20, Line 35, in Claim 12, after "cavity;", insert a linebreak In Column 20, Line 55, in Claim 12, delete "comprises" and insert --comprises:-- therefor In Column 20, Line 66, in Claim 12, after "membrane;", insert a linebreak Signed and Sealed this  
Twenty-ninth Day of July, 2025

Coke Morgan Stewart  
*Acting Director of the United States Patent and Trademark Office*